(12) United States Patent
Okamoto

(10) Patent No.: US 10,770,010 B2
(45) Date of Patent: *Sep. 8, 2020

(54) INFORMATION TERMINAL

(71) Applicant: SEMICONDUCTOR ENERGY LABORATORY CO., LTD., Atsugi-shi, Kanagawa-ken (JP)

(72) Inventor: Yuki Okamoto, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/515,215

(22) Filed: Jul. 18, 2019

(65) Prior Publication Data
US 2019/0340985 A1  Nov. 7, 2019

Related U.S. Application Data

(63) Continuation of application No. 15/627,497, filed on Jun. 20, 2017, now Pat. No. 10,380,956.

(30) Foreign Application Priority Data

Jun. 30, 2016 (JP) ................................ 2016-130327

(51) Int. Cl.
*G09G 3/36* (2006.01)
*H01L 27/12* (2006.01)
(Continued)

(52) U.S. Cl.
CPC ......... *G09G 3/3607* (2013.01); *G09G 3/3233* (2013.01); *G09G 3/3648* (2013.01);
(Continued)

(58) Field of Classification Search
CPC ........ G09G 3/32; G09G 3/323; G09G 3/3233; G09G 3/36; G09G 3/36; G09G 3/3607;
(Continued)

(56) References Cited

U.S. PATENT DOCUMENTS 6,714,268 B2  3/2004  Wang et al.
7,038,614 B1  5/2006  Aker
(Continued)

FOREIGN PATENT DOCUMENTS

EP  2980674 A  2/2016
JP  2001-066593 A  3/2001
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Monica D Harrison
(74) *Attorney, Agent, or Firm* — Nixon Peabody LLP; Jeffrey L. Costellia

(57) ABSTRACT

An information terminal capable of switching display and non-display of images by strain. The information terminal includes a display portion and a strain sensor. The display portion includes a liquid crystal element, a light-emitting element, and a first and a second transistors. The strain sensor includes a strain sensor element and a resistor. The first transistor has a function of controlling current flowing into the light-emitting element. The strain sensor element has a function as a variable resistor. A first terminal of the strain sensor element is electrically connected to a first terminal of the resistor. A gate of the first transistor is electrically connected to a first terminal of the strain sensor element via the second transistor.

28 Claims, 16 Drawing Sheets

(51) Int. Cl.
    *G09G 3/3233* (2016.01)
    *H01L 27/32* (2006.01)
    *H01L 29/786* (2006.01)

(52) U.S. Cl.
    CPC ...... *H01L 27/1225* (2013.01); *H01L 27/3276* (2013.01); *H01L 29/78693* (2013.01); *G09G 2300/023* (2013.01); *G09G 2300/0842* (2013.01); *G09G 2330/021* (2013.01); *G09G 2354/00* (2013.01); *G09G 2380/02* (2013.01)

(58) Field of Classification Search
    CPC ...... G09G 3/364; G09G 3/3648; H01L 29/78; H01L 29/786; H01L 29/7869; H01L 29/78693; H01L 27/12; H01L 27/122; H01L 27/1225; H01L 27/32; H01L 27/327; H01L 27/3276
    USPC .......................................................... 257/43
    See application file for complete search history.

(56) References Cited

U.S. PATENT DOCUMENTS

| | | | |
|---|---|---|---|
| 7,038,641 | B2 | 5/2006 | Hirota et al. |
| 7,084,936 | B2 | 8/2006 | Kato |
| 7,102,704 | B2 | 9/2006 | Mitsui et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,385,654 | B2 | 6/2008 | Mitsui et al. |
| 8,854,286 | B2 | 10/2014 | Yamazaki et al. |
| 8,890,781 | B2 | 11/2014 | Yamazaki et al. |
| 9,165,502 | B2 | 10/2015 | Yamazaki et al. |
| 9,368,082 | B2 | 6/2016 | Yamazaki et al. |
| 9,941,918 | B2 | 4/2018 | Kim et al. |
| 10,380,956 | B2 * | 8/2019 | Okamoto ............ H01L 27/1225 |
| 2003/0201960 | A1 | 10/2003 | Fujieda |
| 2006/0072047 | A1 | 4/2006 | Sekiguchi |
| 2008/0180618 | A1 | 7/2008 | Fujieda |
| 2010/0171905 | A1 | 7/2010 | Huang et al. |
| 2015/0301636 | A1 | 10/2015 | Akimoto et al. |
| 2015/0316958 | A1 | 11/2015 | Takesue |
| 2016/0034047 | A1 | 2/2016 | Lee et al. |
| 2016/0156071 | A1 | 6/2016 | Yamakaji et al. |

FOREIGN PATENT DOCUMENTS

| | | |
|---|---|---|
| JP | 2002-196702 A | 7/2002 |
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2011-141522 A | 7/2011 |
| JP | 2011-141524 A | 7/2011 |
| JP | 2013-221965 A | 10/2013 |
| TW | 201413578 | 4/2014 |
| TW | 201610960 | 3/2016 |
| WO | WO-2004/053819 | 6/2004 |
| WO | WO-2016/017948 | 2/2016 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

10

10

190

INFORMATION TERMINAL

BACKGROUND OF THE INVENTION

1. Field of the Invention

One embodiment of the present invention relates to an information terminal.

In addition, one embodiment of the present invention relates to a semiconductor device. Note that one embodiment of the present invention is not limited to the above technical fields. The technical fields of the invention disclosed in this specification and the like relate to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. In some cases, a display device, a light-emitting device, a memory device, an electro-optical device, a semiconductor circuit, or an electronic device includes a semiconductor device.

2. Description of the Related Art

A display device in which a reflection-type element and a light emission type element are combined has been proposed (Patent Document 1). The reflection-type element is used in bright environments and the light emission type element is used in dark environments, so that it is possible to achieve high display quality independent of environment light and to provide a low power consumption display device.

A technique for using an oxide semiconductor transistor (hereinafter, referred to as an OS transistor) for a display device such as a liquid crystal display or an organic electroluminescence (EL) display has attracted attention.

An OS transistor has an extremely low off-state current. With the use of such an extremely low off-state current, the refresh frequency at the time of displaying still images is reduced, resulting in reduction in power consumption of liquid crystal displays or organic EL displays. Such a technique has been disclosed (Patent Document 2 and Patent Document 3). Note that the aforementioned technique for reducing the power consumption of the display device is referred to as idling stop in this specification.

REFERENCES

Patent Documents

[Patent Document 1] Japanese Published Patent Application No. 2003-157026
[Patent Document 2] Japanese Published Patent Application No. 2011-141522
[Patent Document 3] Japanese Published Patent Application No. 2011-141524

SUMMARY OF THE INVENTION

An object of one embodiment of the present invention is to provide an information terminal capable of switching display and non-display of images by strain. An object of one embodiment of the present invention is to provide a low power consumption information terminal. An object of one embodiment of the present invention is to provide a novel information terminal. An object of one embodiment of the present invention is to provide a novel semiconductor device.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is an information terminal including a reflection-type liquid crystal element, an organic EL element, and a strain sensor. When the strain sensor does not sense strain, light emitted by the organic EL element is sighted by a user of the information terminal. When the strain sensor senses strain, light reflected by the reflection-type liquid crystal element is sighted by the user of the information terminal.

One embodiment of the present invention is an information terminal including a reflection-type liquid crystal element, an organic EL element, and a strain sensor. When the strain sensor does not sense strain, light reflected by the reflection-type liquid crystal element is sighted by a user of the information terminal. When the strain sensor senses strain, light emitted by the organic EL element is sighted by the user of the information terminal.

In the above embodiment, the strain sensor preferably includes a metal thin film resistor.

In the above embodiment, the strain sensor preferably includes a piezoelectric element.

One embodiment of the present invention is an information terminal including a display portion and a strain sensor. The display portion includes a reflection-type liquid crystal element, an organic EL element, and a first transistor. The strain sensor includes a strain sensor element and a resistor. The first transistor has a function of controlling current flowing into the organic EL element. The strain sensor element has a function as a variable resistor. A first terminal of the strain sensor element is electrically connected to a first terminal of the resistor. A gate of the first transistor is electrically connected to the first terminal of the strain sensor element via at least one transistor.

In the above embodiment, the first transistor preferably includes an oxide semiconductor in a channel formation region.

In the above embodiment, the strain sensor element is preferably a metal thin film resistor.

In the above embodiment, the strain sensor element is preferably a piezoelectric element.

One embodiment of the present invention can provide an information terminal capable of switching display and non-display of images by strain. One embodiment of the present invention can provide a low power consumption information terminal. One embodiment of the present invention can provide a novel information terminal. One embodiment of the present invention can provide a novel semiconductor device.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
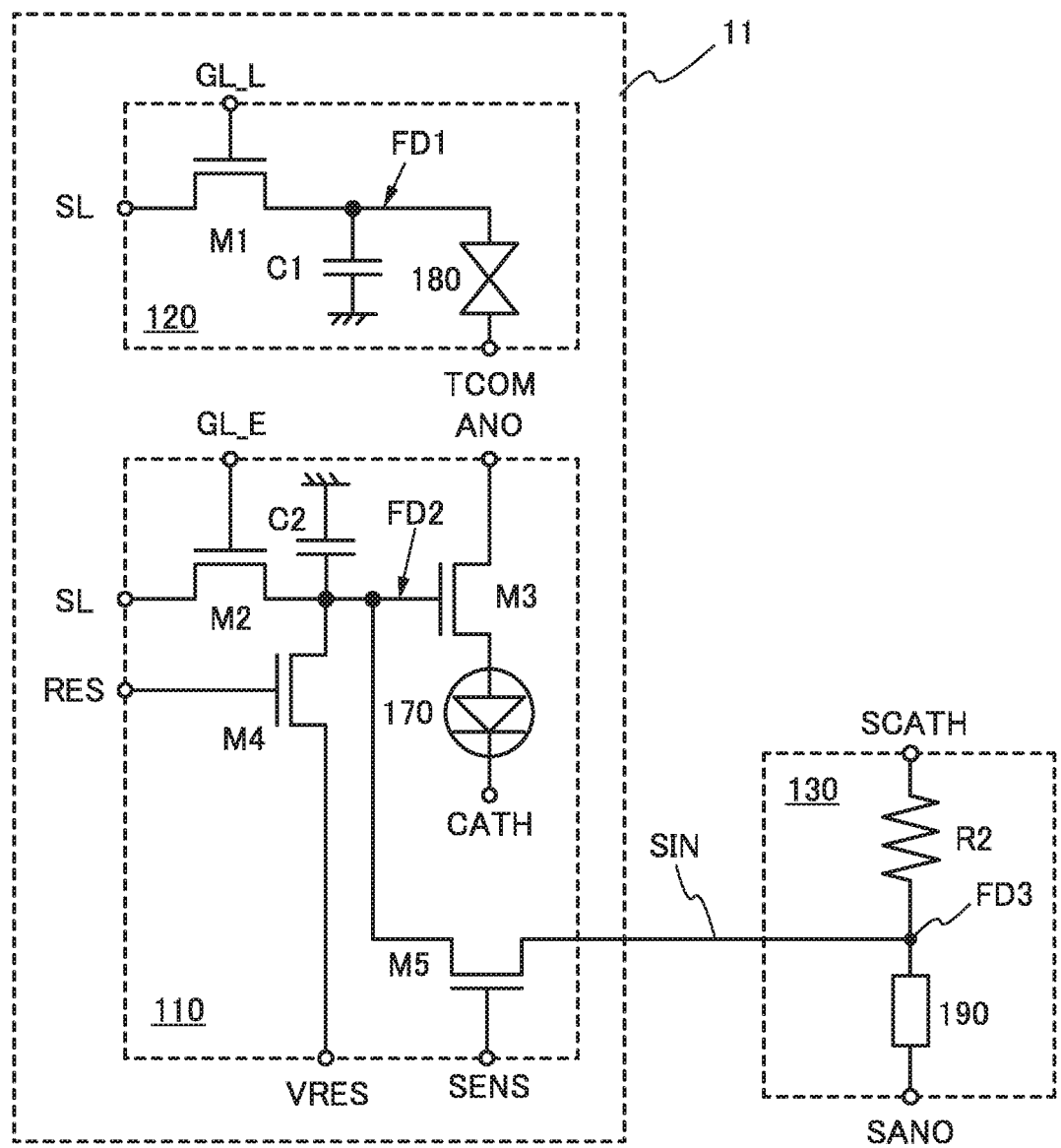
FIG. 1 is a circuit diagram illustrating a structure example of a display pixel and a sensing pixel.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, a high power supply voltage and a low power supply voltage are sometimes referred to as an H level (or $V_{DD}$) and an L level (or GND), respectively.

Furthermore, in the present specification, any of the embodiments described below can be combined as appropriate. In addition, in the case where a plurality of structure examples are described in one embodiment, some of the structure examples can be combined as appropriate.

Embodiment 1

In this embodiment, an information terminal of one embodiment of the present invention will be described.
<<Information Terminal 10>>

Figure 4A:
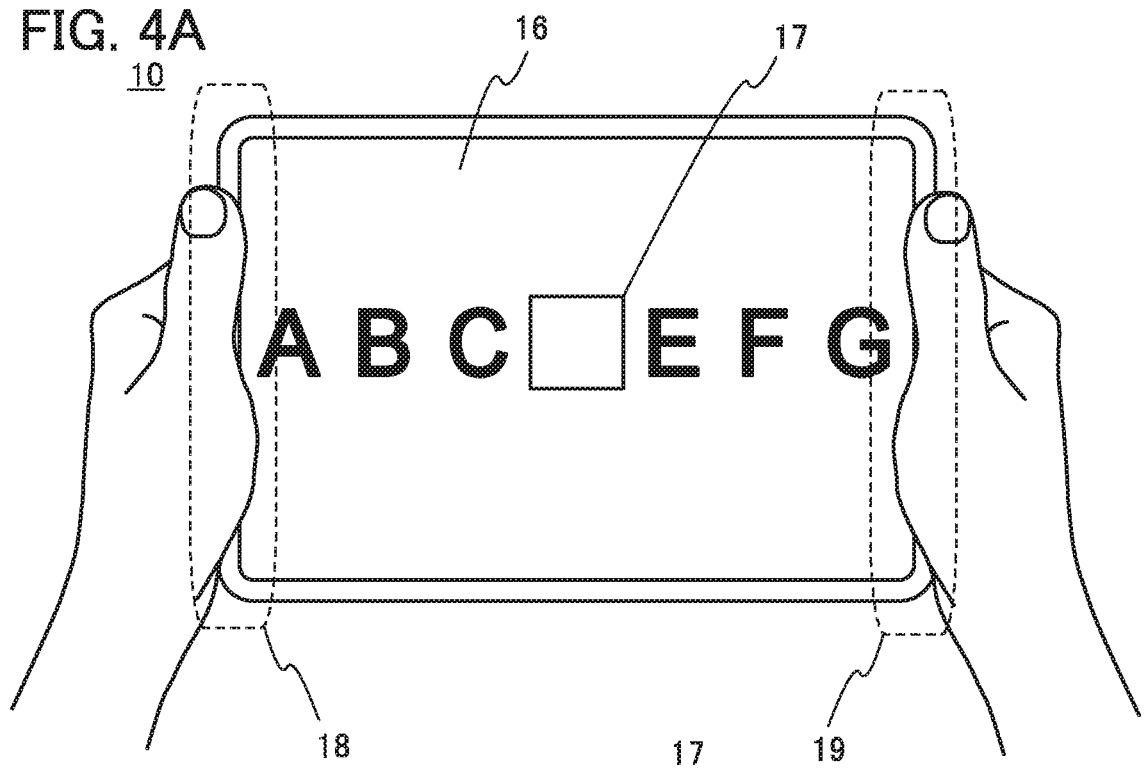
FIGS. 4A and 4B show an embodiment and usage examples of an information terminal.
Figure 4B:
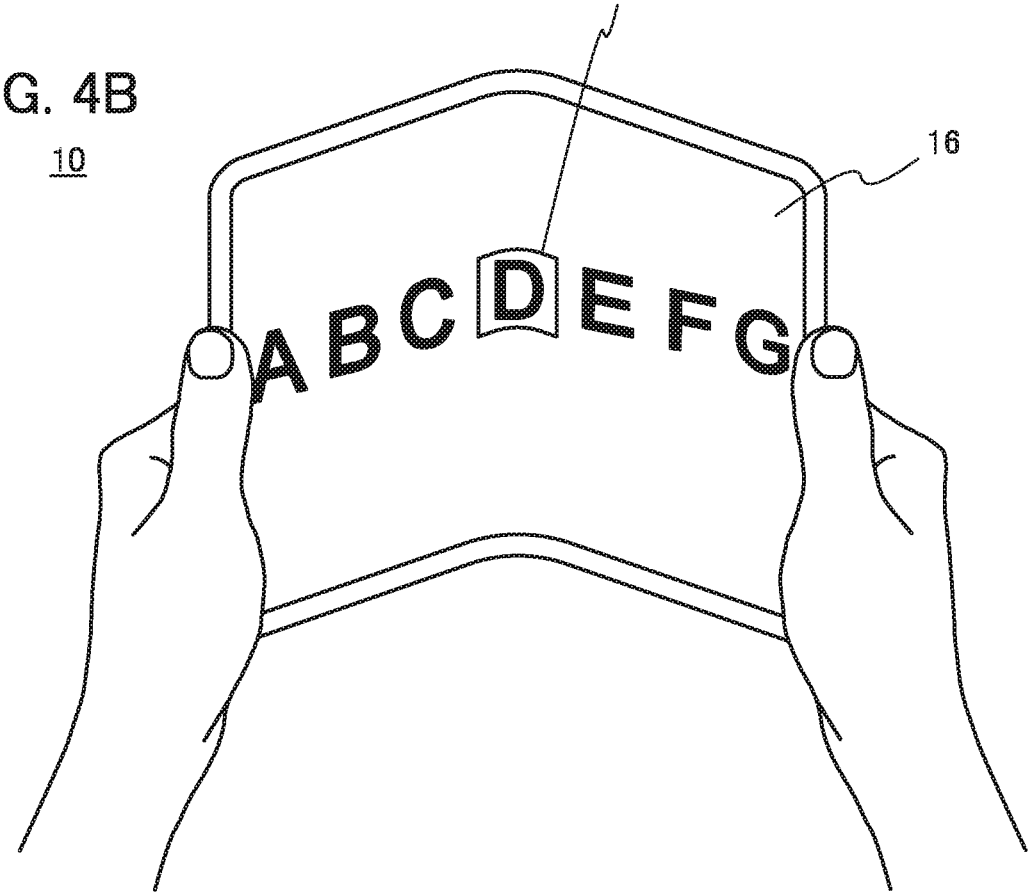

FIGS. 4A and 4B show an embodiment and usage examples of an information terminal 10. The information terminal 10 includes a display region 16.

The display region 16 has a function of displaying information such as images or letters. The display region 16 includes a strain sensor. The information terminal 10 is flexible. The information terminal 10 has a function of sensing the position to which strain is applied and switching display and non-display of images when the user bends the information terminal 10.

FIGS. 4A and 4B are examples in which the information terminal 10 is used as an textbook. In FIG. 4A, strain is not applied to the information terminal 10, and an exercise is displayed on the display region 16. The user guesses which alphabet is inserted in an outlined square 17.

FIG. 4B illustrates the information terminal 10 which is bent by the user. The information terminal 10 has a function of sensing the strain and displaying the letter in a region to which the strain is applied (the outlined square 17). Then, the user can check the answer of the exercise. The direction of strain applied to the information terminal 10 may be a direction in which the outlined square 17 is extended (a direction in which the information terminal 10 is made a mountain fold when seen from the front) or a direction in which the outlined square 17 is compressed (a direction in which the information terminal 10 is made a valley fold when seen from the front). Hereinafter, a case where strain is applied so that the outlined square 17 is extended will be described.

Therefore, even elementary school children or preschool children can easily check the answer because the users can intuitively switch display and non-display of the answer in such a manner.

A region 18 and a region 19, both end portions of the information terminal 10, are preferably inflexible. When the regions 18 and 19 are inflexible, the user can grasp the information terminal 10. In addition, unbendable modules such as a print substrate and a battery are provided inside the region 18 or the region 19, so that the modules can be prevented from being broken.

When using the information terminal 10, the user can bend the information terminal 10 in either the long-side or short-side direction. The information terminal 10 illustrated in FIGS. 4A and 4B is provided with the regions 18 and 19 on the short sides as an example. In this case, the user can bend the information terminal 10 in the short-side direction.

Figure 5A:
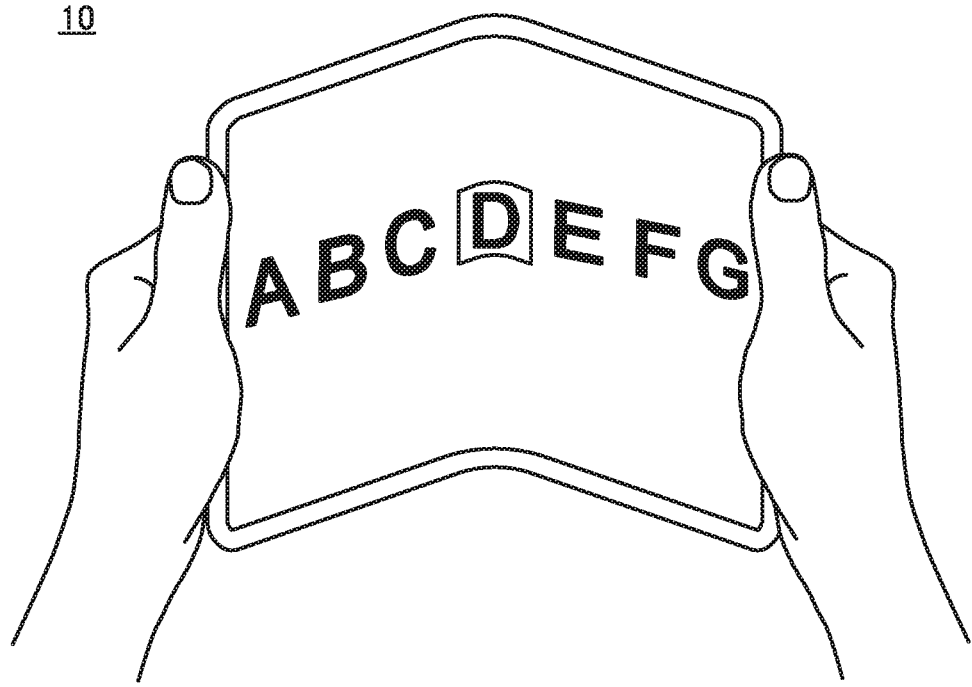
FIGS. 5A and 5B show an embodiment and usage examples of an information terminal.
Figure 5B:
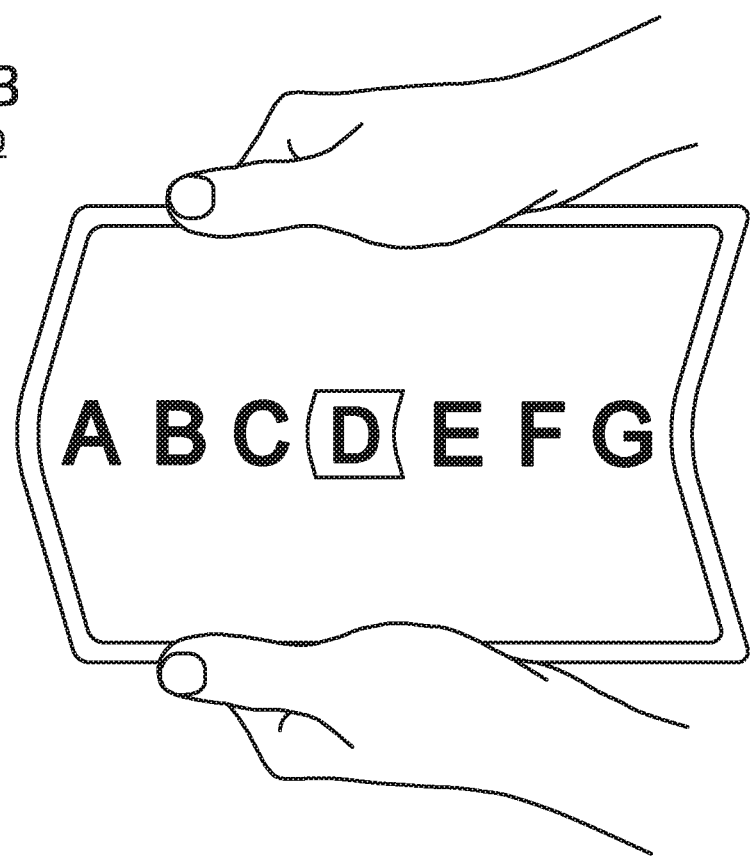

When all the modules used in the information terminal 10, such as the above print substrate and battery, are exchanged for flexible ones, the information terminal 10 is bendable not only in the short-side direction (FIG. 5A) but also in the long-side direction (FIG. 5B) as illustrated in FIGS. 5A and 5B. In this case, there is no need that the regions 18 and 19 are inflexible.

Figure 6:
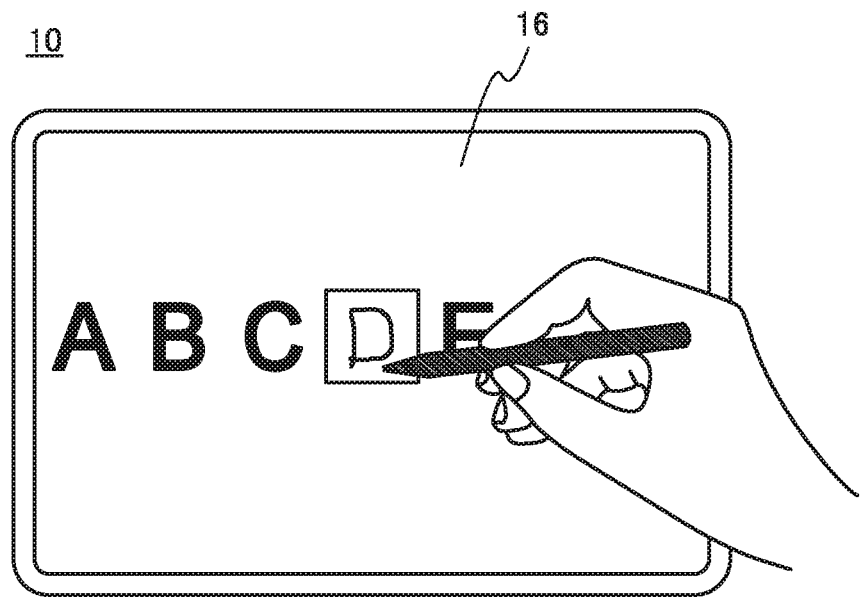
FIG. 6 shows an embodiment and an usage example of an information terminal.

The display region 16 may include a touch sensor. The user of the information terminal 10 can input information such as letters, lines, or diagrams with a finger, a stylus, or the like (FIG. 6). Information which the user inputs by hand is sensed by the touch sensor and displayed on the display region 16.

Next, an example of the modules included in the information terminal 10 will be described with reference to FIG. 8.

Figure 8:
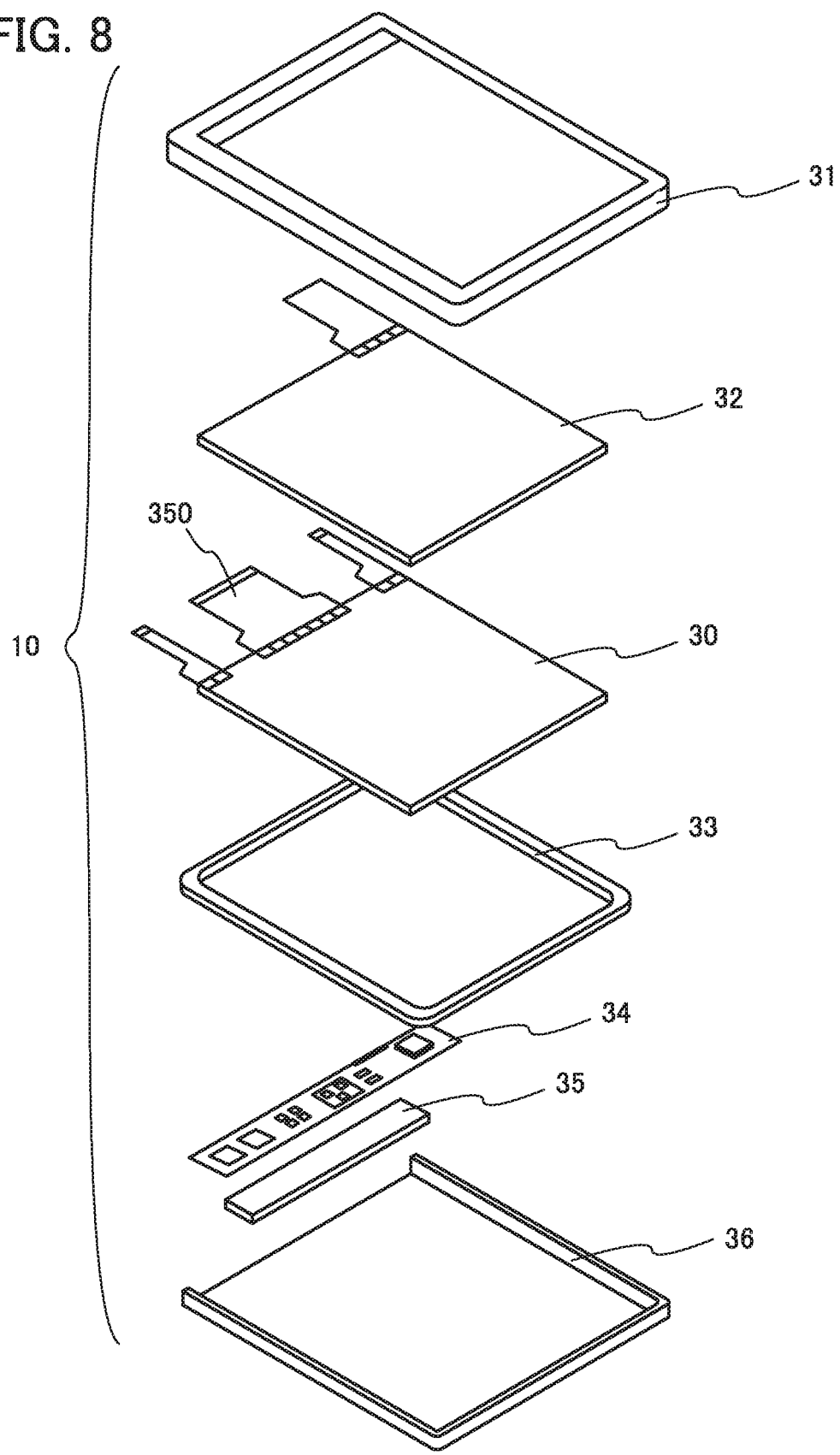
FIG. 8 is an exploded view of an information terminal.

The information terminal 10 illustrated in FIG. 8 includes, between an upper cover 31 and a lower cover 36, a touch panel 32, a display panel 30 connected to an FPC 350, a frame 33, a print substrate 34, and a battery 35. The shapes and sizes of the upper cover 31 and the lower cover 36 can be changed as appropriate in accordance with the shapes and sizes of the display panel 30. The upper cover 31, the lower cover 36, the display panel 30, and the frame 33 are preferably flexible. When these modules are flexible, the information terminal 10 is also flexible.

In the information terminal 10 illustrated in FIG. 8, the print substrate 34 and the battery 35 are provided in the inflexible regions 18 and 19 as an example.

Figure 9A:
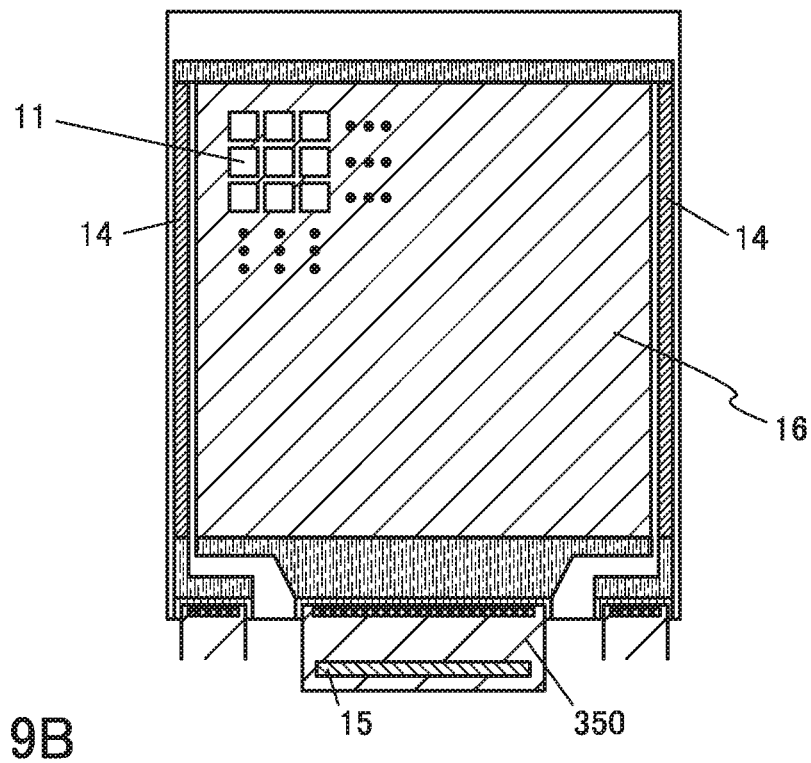
FIGS. 9A and 9B are top views each illustrating a structure example of a display panel.
Figure 9B:
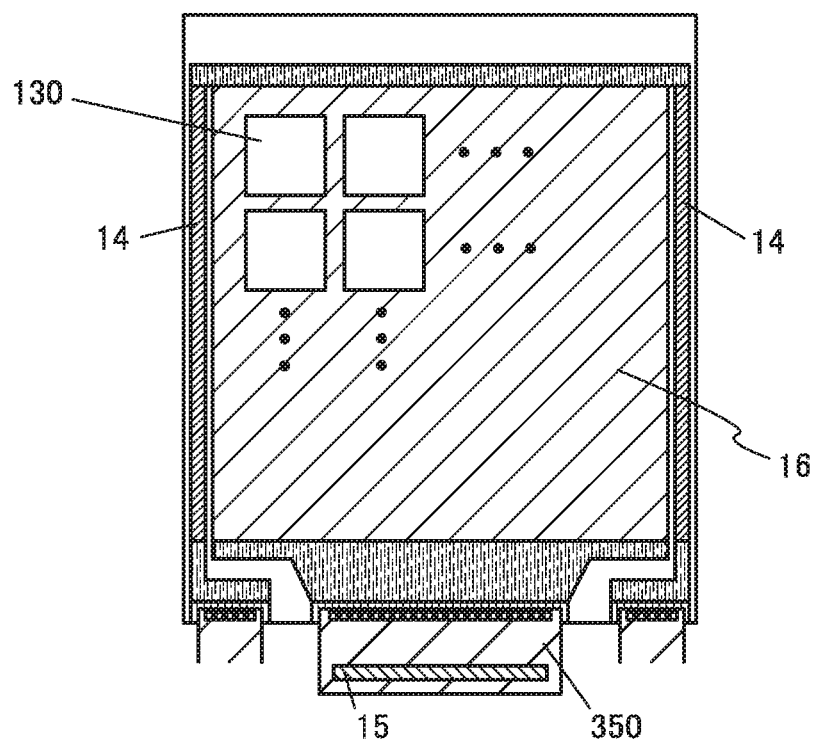

FIGS. 9A and 9B are top views each illustrating a structure example of the display panel 30 included in the information terminal 10. The display panel 30 includes the display region 16, the FPC 350, gate drivers 14, and a source driver 15.

The display region 16 includes display pixels 11 arranged in a matrix (FIG. 9A). The display pixel 11 includes a display element (an EL element, a liquid crystal element, or the like) and has a function of displaying images, letters, and the like.

The display region 16 includes sensing pixels 130 arranged in a matrix (FIG. 9B). The sensing pixel 130 includes a strain sensor element and has a function of sensing strain applied to the information terminal 10.

The display pixel 11 and the sensing pixel 130 have a region where they overlap each other.

<<Display Pixel and Sensing Pixel>>

Next, a circuit configuration example of the display pixel 11 and the sensing pixel 130 will be described with reference to a circuit diagram in FIG. 1.

<Display pixel 11>

In FIG. 1, the display pixel 11 includes a pixel circuit 120 and a pixel circuit 110.

The pixel circuit 120 includes a transistor M1, a capacitor C1, and a liquid crystal element 180. A first terminal of the liquid crystal element 180 is referred to as a node FD1.

The transistor M1 has a function as a switch and has a function of controlling conduction between a wiring SL and the node FD1. On/off of the transistor M1 is controlled by a potential applied to a wiring GL_L. A second terminal of the liquid crystal element 180 is electrically connected to a wiring TCOM. A given constant potential is applied to the wiring TCOM.

The capacitor C1 has a function of retaining a charge that is written to the node FD1.

The wiring SL has a function as a signal line. The wiring GL_L has a function as a scan line.

When the transistor M1 is turned on, video data (analog data) is written from the wiring SL to the node FD1. The alignment of the liquid crystal element 180 is changed in response to the charge written to the node FD1, so that the light transmittance of the liquid crystal element 180 is changed.

A reflection-type liquid crystal element is preferably used as the liquid crystal element 180. The use of a reflection-type liquid crystal element can reduce the power consumption. In addition, an image with high contrast can be favorably displayed under bright external light. Instead of the liquid crystal element 180, a shutter-type micro electro mechanical systems (MEMS) element, an optical-interference-type MEMS element, a display element which displays images using external light reflection by a microcapsule method, an electrophoretic method, an electrowetting method, an Electronic Liquid Powder (registered trademark) method, or the like can be used.

The liquid crystal element 180 will be described below as a reflection-type liquid crystal element. The description hereinafter is made on the assumption that the information terminal 10 is used under extremely bright external light and that display by the reflection-type liquid crystal element is recognizable by the user of the information terminal 10.

The pixel circuit 110 includes a transistor M2, a transistor M3, a transistor M4, a transistor M5, a capacitor C2, and a light-emitting element 170. Note that a gate of the transistor M3 is referred to as a node FD2.

The transistors M2 and M4 have functions as switches. The transistor M2 has a function of controlling conduction between the wiring S1, and the node FD2. On/off of the transistor M2 is controlled by a potential applied to a wiring GL_E. The transistor M4 has a function of controlling conduction between a wiring VRES and the node FD2. On/off of the transistor M4 is controlled by a potential applied to a wiring RES. One of a source and a drain of the transistor M3 is electrically connected to a wiring ANO, and the other of the source and the drain of the transistor M3 is electrically connected to a first terminal of the light-emitting element 170. A second terminal of the light-emitting element 170 is electrically connected to a wiring CATH.

The capacitor C2 has a function of retaining a charge that is written to the node FD2.

A reset signal which initializes the node FD2 is applied to the wiring RES. When the transistor M4 is turned on, the node FD2 is initialized by the potential of the wiring VRES.

The transistor M3 is a driver transistor of the light-emitting element 170 and has a function of controlling current flowing into the light-emitting element 170 by the potential of the node FD2.

As the light-emitting element 170, a self-luminous display element such as an organic EL element, an inorganic EL element, a light-emitting diode, or a quantum-dot light emitting diode (QLED) can be used. An organic EL element is particularly preferable because a large display element with low power consumption can be provided. The light-emitting element 170 will be described below as an organic EL element.

The wiring ANO has a function as an anode of the light-emitting element 170 and the wiring CATH has a function as a cathode of the light-emitting element 170.

The wiring SL has a function as a signal line and the wiring GL_E has a function as a scan line.

When the transistor M2 is turned on, video data (analog data) is written from the wiring SL to the node FD2. The transistor M3 allows drain current to flow by the potential of the node FD2. The light-emitting element 170 emits light in response to the drain current.

<Sensing Pixel 130>

The sensing pixel 130 in FIG. 1 includes a resistor R2 and a strain sensor element 190. A first terminal of the resistor R2 is electrically connected to a wiring SCATH. A second terminal of the resistor R2 is electrically connected to a first terminal of the strain sensor element 190. A second terminal of the strain sensor element 190 is electrically connected to a wiring SANO. Note that a node of the second terminal of the resistor R2 and the first terminal of the strain sensor element 190 is referred to as a node FD3.

The strain sensor element 190 is a variable resistor that changes resistance value in response to applied strain. As the strain sensor element 190, typically, a metal thin film resistor can be used. The amount of strain in the vicinity of the region where the metal thin film resistor is provided can be measured on the basis of the amount of change in the resistance of the metal thin film resistor. The metal thin film resistor has a function of increasing the resistance value when tractive force is applied to the metal thin film and a function of decreasing the resistance value when compression force is applied to the metal thin film, for example.

As the strain sensor element 190, a piezoelectric element can also be used. As the piezoelectric element, an element including a piezoelectric substance such as barium titanate, lead zirconate titanate, or zinc oxide can be used.

The wiring SANO has a function as an anode of the strain sensor element 190 and the wiring SCATH has a function as a cathode of the strain sensor element 190.

The strain sensor element 190 will be described below as a variable resistor. When the resistance value of the strain sensor element 190 is $R_1$, the resistance value of the resistor R2 is $R_2$, the potential of the wiring SANO is Va, and the potential of the wiring SCATH is Vc, the potential of the node FD3 ($V_{FD3}$) can be expressed by the following formula.

[Formula 1]

$$V_{FD3} = \frac{R_2}{R_1 + R_2} Va + \frac{R_1}{R_1 + R_2} Vc \quad (1)$$

On the assumption that Va is larger than Vc, when $R_1$ of the strain sensor element 190 increases, $V_{FD3}$ is decreased according to Formula (1). In contrast, when $R_1$ of the strain sensor element 190 decreases, $V_{FD3}$ is increased.

As illustrated in FIG. 1, data of the node FD3 is written to the node FD2 via a wiring SIN and the transistor M5. That is, data of the sensing pixel 130 is transferred to the pixel circuit 110.

The transistor M5 has a function as a switch. The transistor M5 has a function of controlling conduction between the node FD3 and the node FD2. On/off of the transistor M5 is controlled by a potential applied to a wiring SENS.

Next, operations of the display pixel 11 and the sensing pixel 130 will be described.

First, the information terminal 10 which is not bent as illustrated in FIG. 4A is considered. At this time, the resistance value of the strain sensor element 190 becomes low and the potential of the node FD3 becomes high. When an H level is applied to the wiring SENS, the transistor M5 is turned on and the potential of the node FD3 is written to the node FD2. The potential of the node FD2 becomes high, and the transistor M3 allows current to flow. The light-emitting element 170 emits intense light.

The liquid crystal element 180 is a reflection-type liquid crystal element. When the light-emitting element 170 emits intense light, light reflected by the liquid crystal element 180 placed in the same display pixel 11 is canceled by light from the light-emitting element 170, so that display by the liquid crystal element 180 cannot be sighted by the user.

In FIG. 4A, intense white light is emitted by the light-emitting elements 170 placed inside the outlined square 17, whereas light is not emitted by the light-emitting elements 170 placed outside the outlined square 17.

In FIG. 4A, although all the alphabets (A, B, C, D, E, F, and G) are displayed by the liquid crystal element 180, intense white light is emitted inside the outlined square 17 by the light-emitting elements 170 and cancels display of the alphabet (D).

Next, the information terminal 10 which is bent as illustrated in FIG. 4B is considered. At this time, the resistance value of the strain sensor element 190 becomes high and the potential of the node FD3 becomes low. When an H level is applied to the wiring SENS, the transistor M5 is turned on and the potential of the node FD3 is written to the node FD2. The potential of the node FD2 becomes low, and the transistor M3 allows to flow current slightly (or is turned off). The light-emitting element 170 emits weak light (or does not emit light). When the light emitted from the light-emitting element 170 is weakened, light reflected by the liquid crystal element 180 can be sighted by the user.

In FIG. 4B, the sensing pixel 130 inside the outlined square 17 senses strain, so that the light-emitting elements 170 inside the outlined square 17 emit weaker light. The user can sight display by the liquid crystal element 180. As a result, the user can read the alphabet (D) inside the outlined square 17.

In the information terminal 10, information sensed by the sensing pixel 130 can be directly transmitted to the display pixel 11 without via special external circuits. The information terminal 10 can simplify its circuit configuration because special external circuits are not required.

The transistors M1 to M5 preferably have a low current (off-state current) flowing between a source and a drain in an off state. Here, the term "low off-state current" means that a normalized off-state current per micrometer of channel width with a voltage between a source and a drain set at 1.8 V is $1 \times 10^{-20}$ A or lower at room temperature, $1 \times 10^{-18}$ A or lower at 85° C., or $1 \times 10^{-16}$ A or lower at 125° C. An example of a transistor with such a low off-state current is an OS transistor.

OS transistors are used as the transistors M1 to M5, so that the aforementioned idling stop can be performed in the pixel circuits 120 and 110. As a result, the information terminal 10 with low power consumption can be provided.

Examples of oxide semiconductors that can be used for the above OS transistor include an In—Ga oxide, an In—Zn oxide, and an In-M-Zn oxide (M is Ti, Ga, Y, Zr, La, Ce, Nd, Sn, or Hf). Note that the oxide semiconductor is not limited to an oxide containing In. The oxide semiconductor may be, for example, a Zn oxide, a Zn—Sn oxide, or a Ga—Sn oxide.

The OS transistor preferably includes a cloud-aligned composite oxide semiconductor (CAC-OS) in a channel formation region. The OS transistor including a CAC-OS has a high on-state current and is highly reliable. Note that the details of the CAC-OS will be described later in Embodiment 4.

Figure 2:
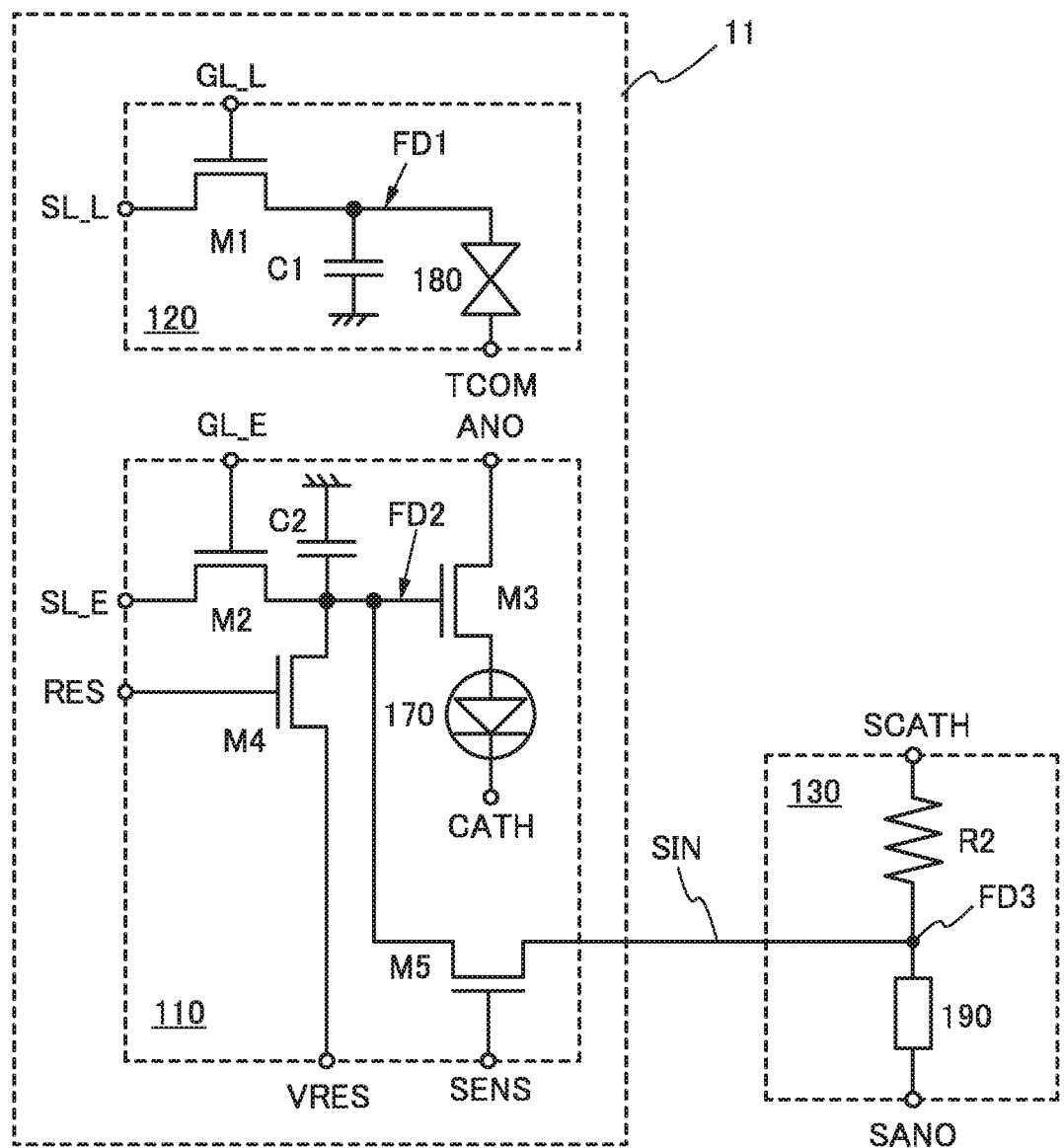
FIG. 2 is a circuit diagram illustrating a structure example of a display pixel and a sensing pixel.

Note that although a signal line of the pixel circuit 120 and a signal line of the pixel circuit 110 are a common signal line (a wiring SL) in FIG. 1, the pixel circuit 120 and the pixel circuit 110 may be connected to different signal lines. For example, a wiring SL_L may be provided as a signal line of the pixel circuit 120 and a wiring SL_E may be provided as a signal line of the pixel circuit 110 (see FIG. 2). This enables the pixel circuit 120 and the pixel circuit 110 to drive independently.

Figure 3:
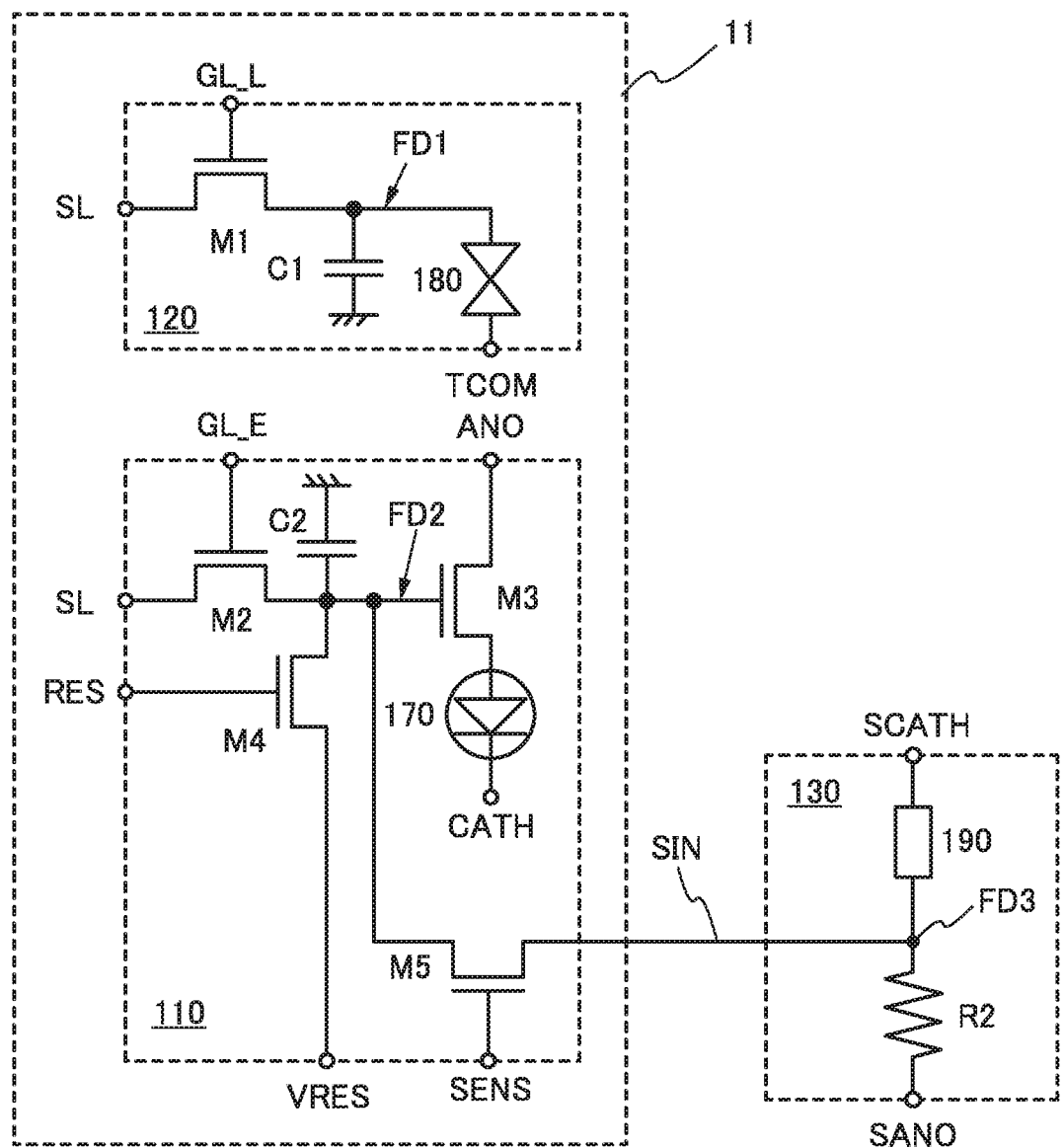
FIG. 3 is a circuit diagram illustrating a structure example of a display pixel and a sensing pixel.

Note that the light-emitting element 170 may be configured to emit intense light when the information terminal 10 is bent. A structure example of the display pixel 11 and the sensing pixel 130 in such a case is shown in FIG. 3. The sensing pixel 130 illustrated in FIG. 3 is different from the sensing pixel 130 illustrated in FIG. 1 in that positions of the strain sensor element 190 and the resistor R2 are interchanged. In this structure, when the strain sensor element 190 senses strain, the potential of the node FD3 becomes high. When the transistor M5 is turned on, the potential of the node FD3 is transmitted to the node FD2, and an on-state current flows to the transistor M3, so that intense light is emitted by the light-emitting element 170.

Figure 7A:
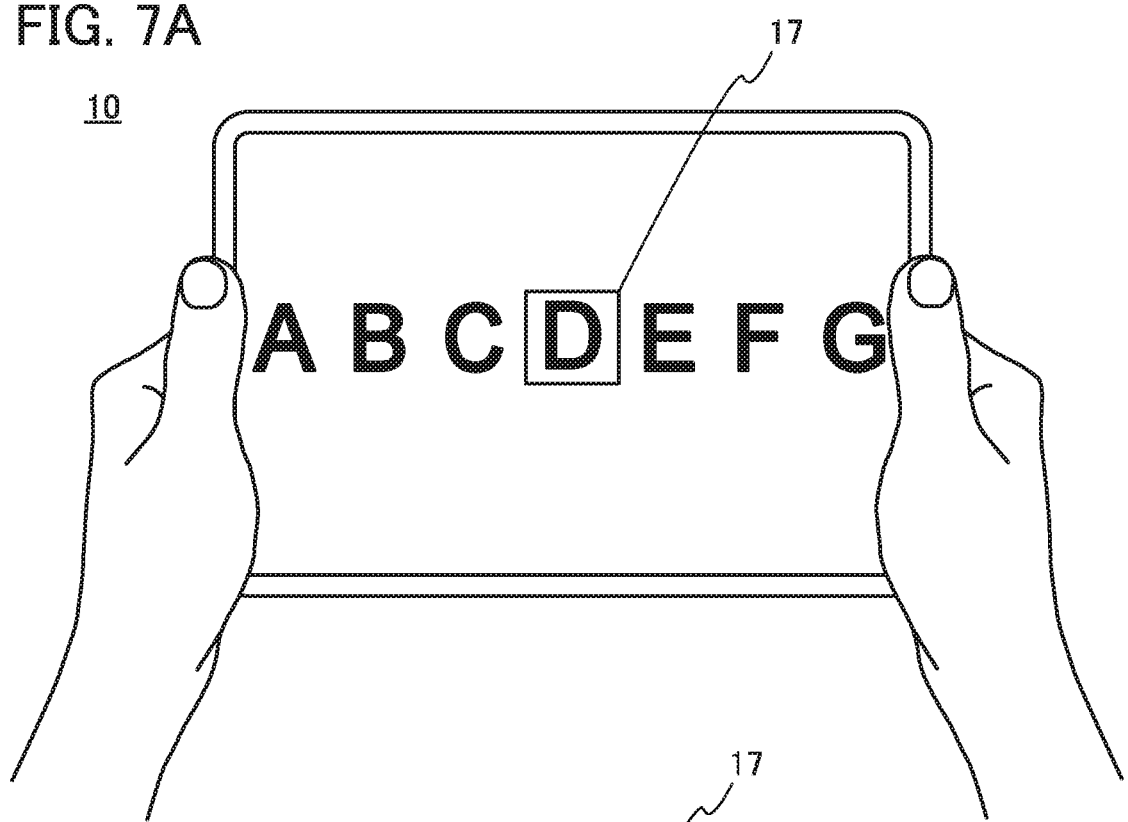
FIGS. 7A and 7B show an embodiment and usage examples of an information terminal.
Figure 7B:
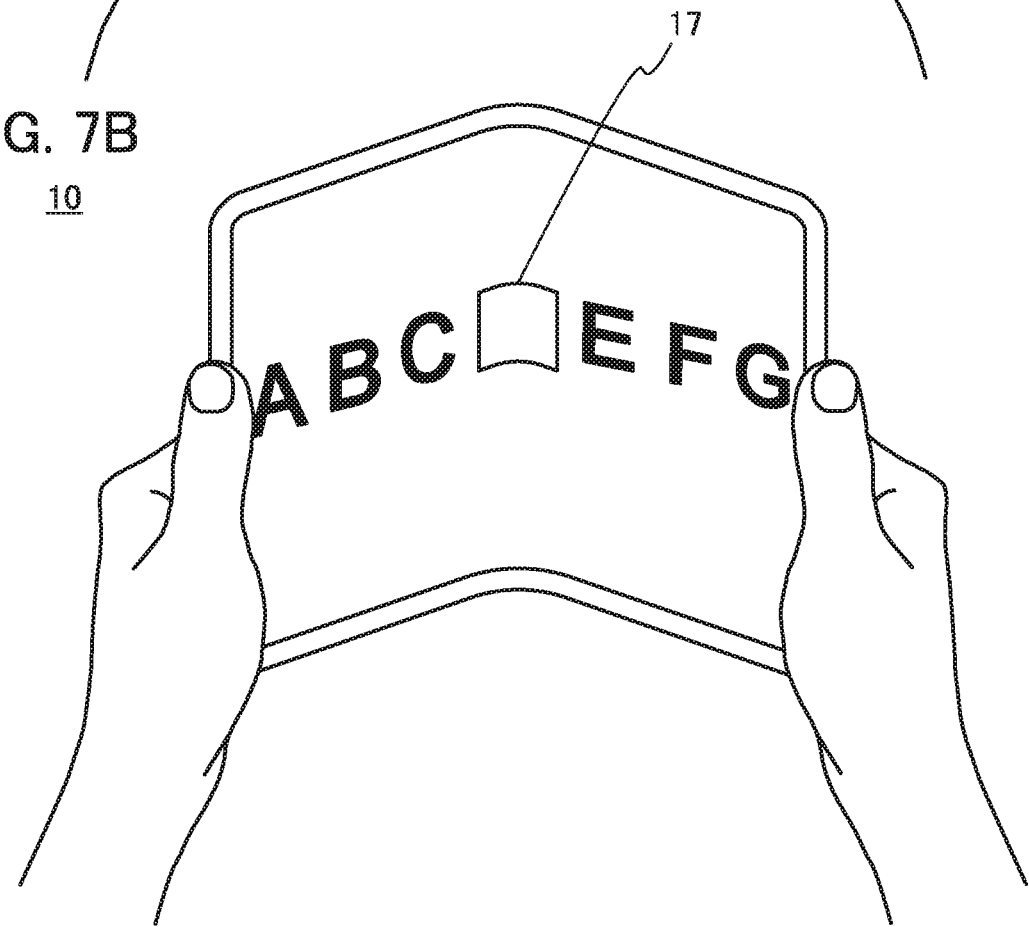

The information terminal 10 which includes the display pixel 11 and the sensing pixel 130 in FIG. 3 can have an inverse function to the information terminal 10 in FIGS. 4A and 4B. As illustrated in FIG. 7A, the alphabet (D) displayed inside the outlined square 17 can be sighted by the user when strain is not applied to the information terminal 10. That is, the user can sight light reflected by the liquid crystal element 180. In contrast, as illustrated in FIG. 7B, the user cannot sight display of the alphabet inside the outlined square 17 when strain is applied to the information terminal 10. That is, light of the light-emitting element 170 can be sighted, but light reflected by the liquid crystal element 180 cannot be sighted.

<<Display Pixel Array 12 and Sensing Pixel Array 13>>

Figure 10:
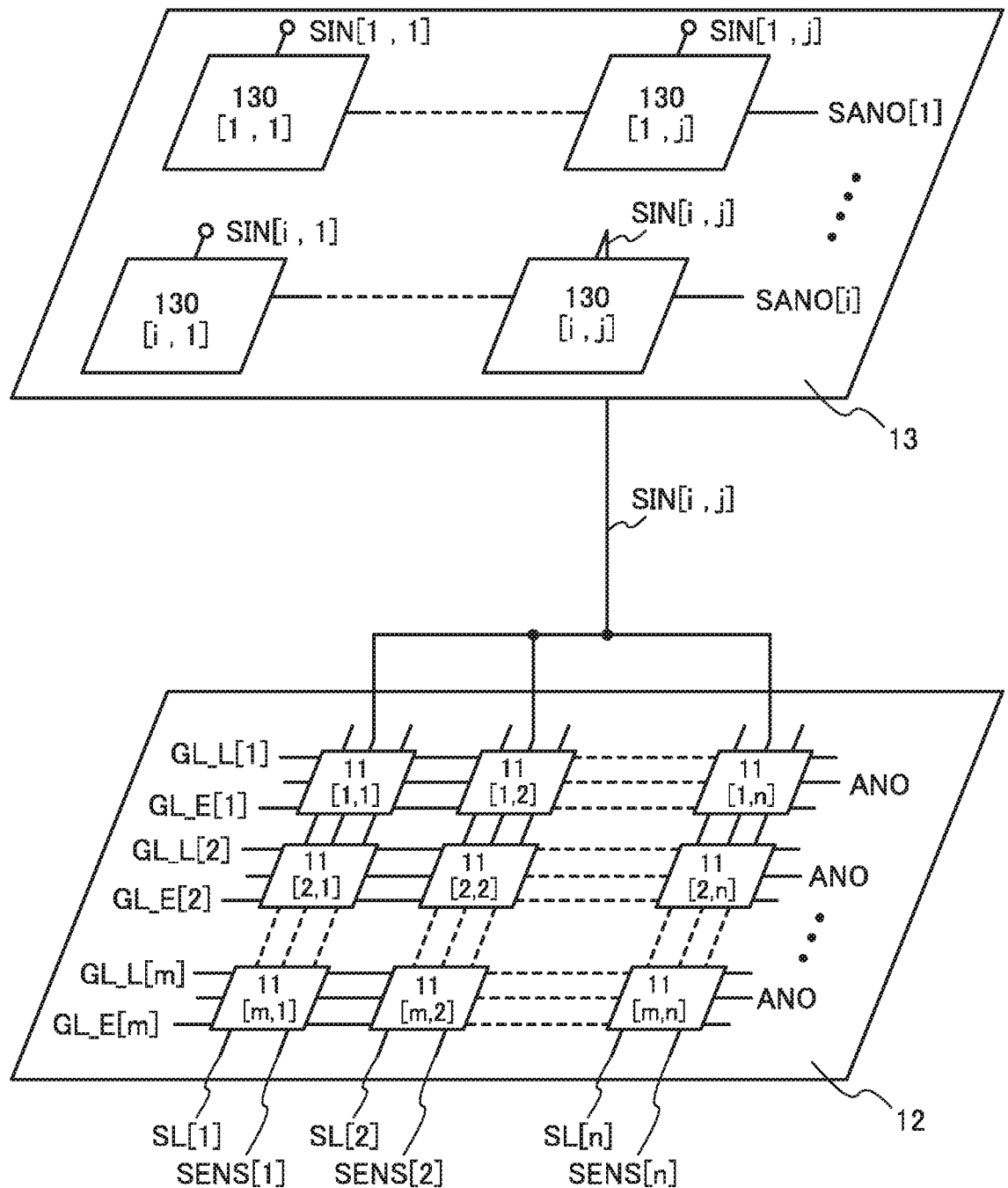
FIG. 10 is a block diagram illustrating a structure example of a display pixel array and a sensing pixel array.

FIG. 10 is a block diagram illustrating a connection relation of the display pixel array 12 and the sensing pixel array 13. The display pixel array 12 includes the display pixels 11 arranged in a matrix with m rows and n columns (m and n are each an integer of 2 or more). The sensing pixel array 13 includes the sensing pixels 130 arranged in a matrix with i rows and j columns (i and j are each an integer of 2 or more).

Display pixels 11[1,1] to 11[m,1] arranged in a line share a wiring SL[1] and a wiring SENS[1]. Similarly, display pixels 11[1,n] to 11 [m,n] arranged in a line share a wiring SL[n] and a wiring SENS[n].

Display pixels 11 [1,1] to 11[1,n] horizontally arranged share a wiring GL_L[1], a wiring GL_E[1], and the wiring ANO. Similarly, display pixels 11[m,1] to 11[m,n] horizontally arranged share a wiring GL_L[m], a wiring GL_E[m], and the wiring ANO.

Sensing pixels 130[1,1] to 130[1,j] horizontally arranged share a wiring SANO[1]. Similarly, sensing pixels 130[i,1] to 130[i,j] horizontally arranged share a wiring SANO[i].

Display pixels 11[1,1] to 11[m,n] are connected to the sensing pixel 130 [i,j] via a wiring SIN [i,j] That is, a plurality of the display pixels 11 share one of the sensing pixels 130.

In FIG. 10, potentials are independently applied to the wirings SANO[1] to SANO[i]. Any one of a high potential (a potential higher than that of the wiring SCATH) and a low potential (the same potential as the wiring SCATH) is preferably applied to each of the wirings SANO[1] to SANO[i].

In FIG. 10, the same potentials are applied to all the wirings ANO. A potential higher than that of the wiring CATH is preferably applied to the wiring ANO.

In the information terminal 10, as illustrated in FIGS. 4A and 4B, light emission by the light-emitting element 170 is needed to be forbidden outside a certain region (the outlined square 17) regardless of whether strain is applied or not. In FIG. 10, the wirings SANO and the wirings SENS can perform selection of the above region. When a low potential is applied to the wirings SANO[i], for example, the potential of the wiring SIN[i,j] becomes also low; therefore, all the display pixels 11 that are connected to the wiring SIN [i,j] cannot make the light-emitting element 170 to emit light regardless of whether strain is applied or not.

The display pixel array 12 and the sensing pixel array 13 may apply an independent potential to each of the wirings ANO and may apply a common potential to all of the wirings SANO. A block diagram in that case is shown in FIG. 16.

Figure 16:
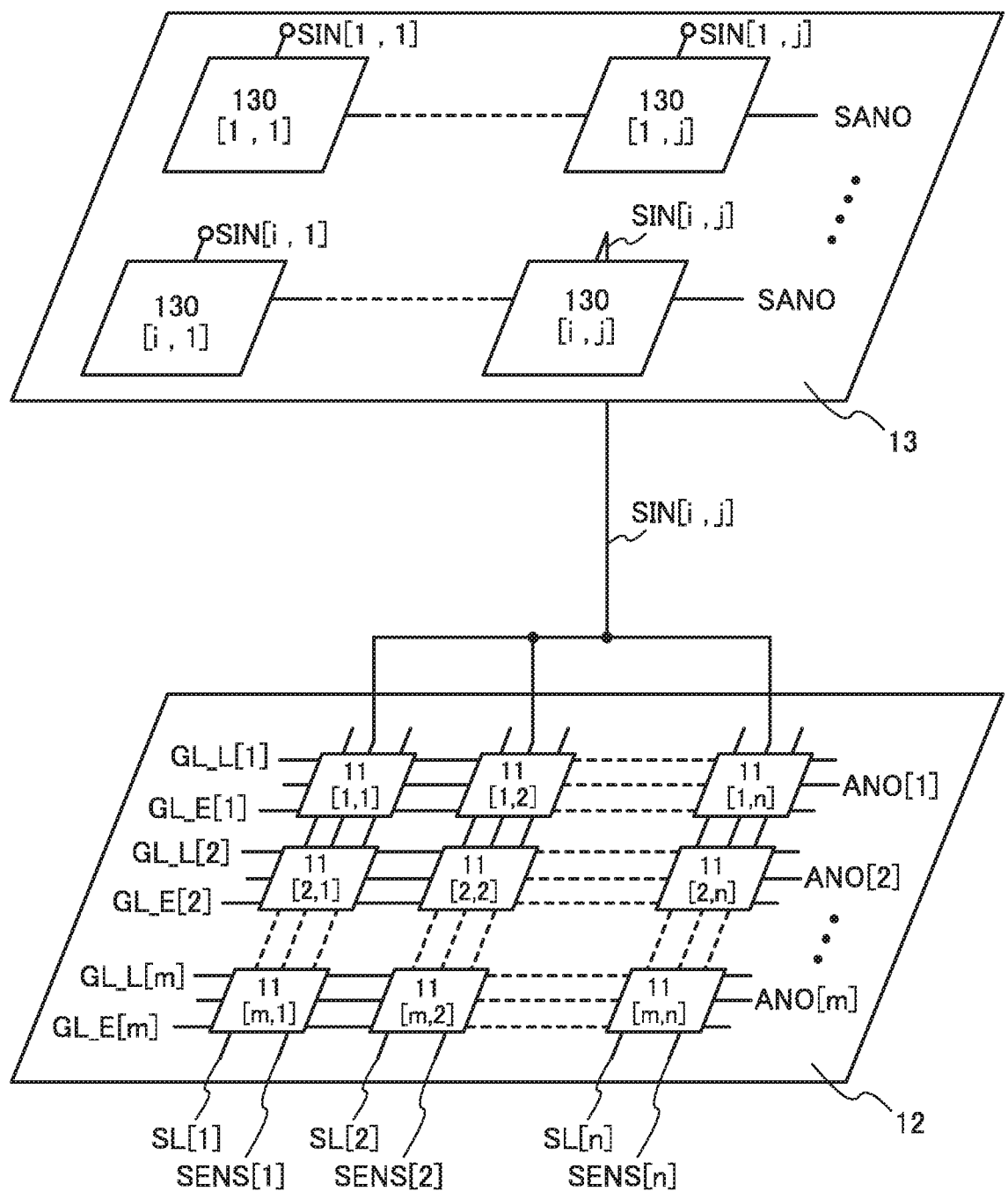
FIG. 16 is a block diagram illustrating a structure example of a display pixel array and a sensing pixel array.

In FIG. 16, any one of a high potential (a potential higher than that of the wiring CATH) and a low potential (the same potential as the wiring CATH) is preferably applied to each of the wirings ANO[1] to ANO[m]. In addition, a potential higher than that of the wiring SCATH is preferably applied to the wiring SANO.

In FIG. 16, the wirings ANO and the wirings SENS can perform selection of the above region. When a low potential is applied to the wirings ANO[m], for example, the display pixel 11[m,n] cannot make the light-emitting element 170 to emit light regardless of whether strain is applied or not, <<Timing Chart>>

Figure 11:
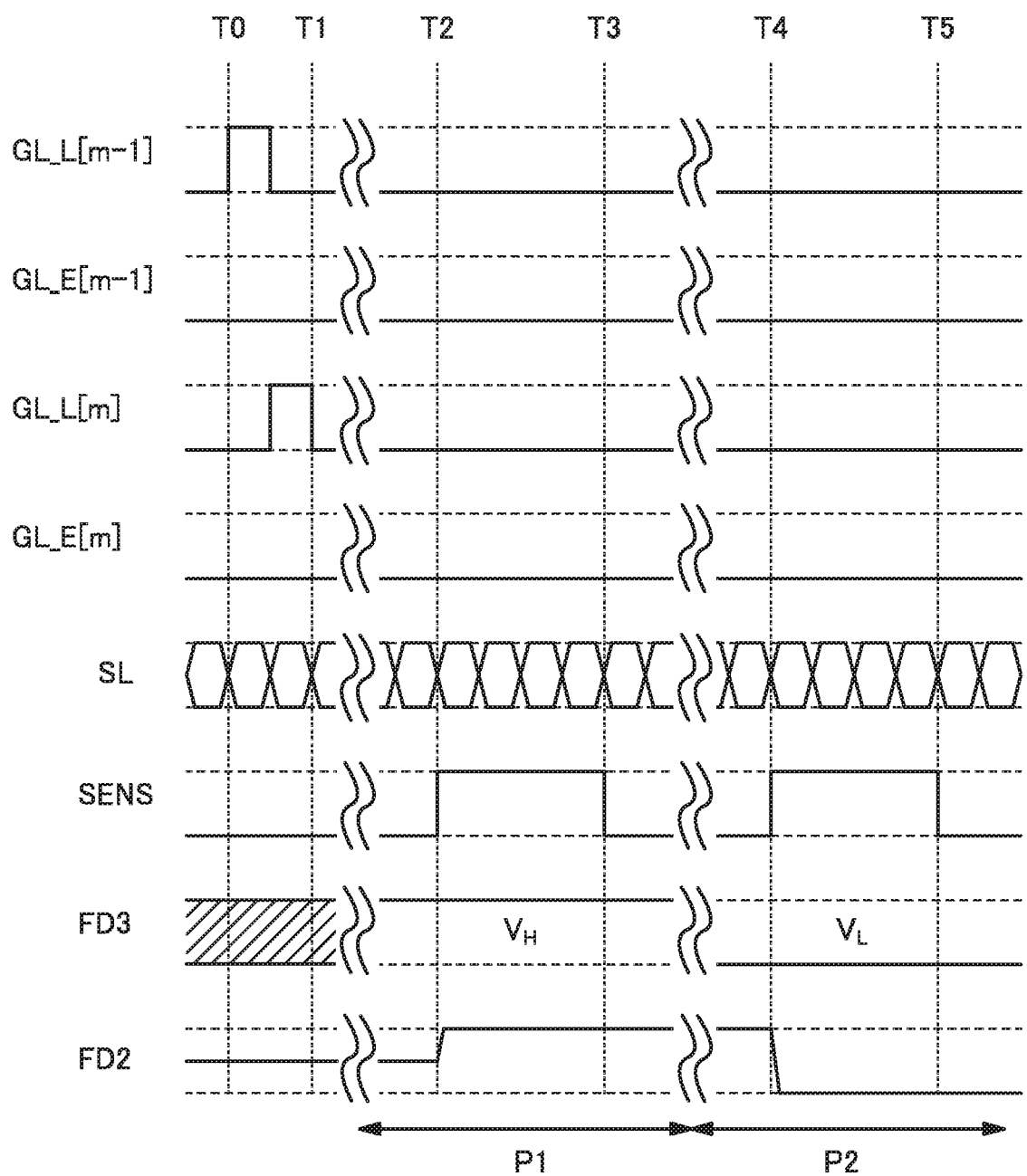
FIG. 11 is a timing chart showing an operation example of a display pixel and a sensing pixel.

Next, an operation example of the information terminal 10 will be described with reference to a timing chart in FIG. 1. FIG. 11 shows potentials of the wiring GL_L[m−1], the wiring GL_E[m−1], the wiring GL_L[m], the wiring GL_E [m], the wiring SL, the wiring SENS, the node FD3, and the node FD2 Times T0 to T5 are given in FIG. 11 to show operation timings. In addition, Period P1 in FIG. 11 shows a period during which strain is not applied to the information terminal 10, and Period P2 shows a period during which strain is applied to the information terminal 10.

From Time T0 to Time T1, the wiring GL_L[m−1] and the wiring GL_L[m] are selected sequentially (or an H level potential is applied), and then, video signals are input sequentially to the display pixels 11[m−1] and 11[m] from the wiring SL. The information terminal 10 performs display by the liquid crystal element 180. At this time, an L level potential is applied to the wiring SENS, the wiring GL_E [m−1], and the wiring GL_E[m], and display by the light-emitting element 170 is not performed.

In Period P1, strain is not applied to the information terminal 10. Therefore, the potential of the node FD3 becomes high ($V_H$).

In Time T2, the potential of the wiring SENS becomes an H level from an L level, and the node FD3 and the node FD2 are electrically connected to each other via the transistor M5. The potential of the node FD2 becomes $V_H$.

In Time T3, the potential of the wiring SENS becomes an L level, and the transistor M5 is turned off. The potential of the node FD2 is fixed at $V_H$, and the light-emitting element 170 emits light. The light-emitting element 170 emits intense light because $V_H$ is a high potential.

In Period P2, strain is applied to the information terminal 10. Therefore, the potential of the node FD3 becomes low ($V_L$).

In Time T4, the potential of the wiring SENS becomes an H level from an L level, and the node FD3 and the node FD2 are electrically connected to each other via the transistor M5. The potential of the node FD2 becomes $V_L$.

In Time T5, the potential of the wiring SENS becomes an L, level, and the transistor M5 is turned off. The potential of the node FD2 is fixed at $V_L$, and the light-emitting element 170 becomes in a non-light-emitting state.

As described above, with the use of the information terminal 10 described in this embodiment, an information terminal capable of switching display and non-display of images by strain can be provided. Alternatively, a low power consumption information terminal can be provided. Alternatively, a novel information terminal can be provided.

Embodiment 2

In the information terminal 10 described in Embodiment 1, the potential of the node FD3 is not output as digital data and finally converted into a light emission intensity of the light-emitting element 170. In this embodiment, a structure in which the potential of the node FD3 can be output as digital data will be described.

Figure 12:
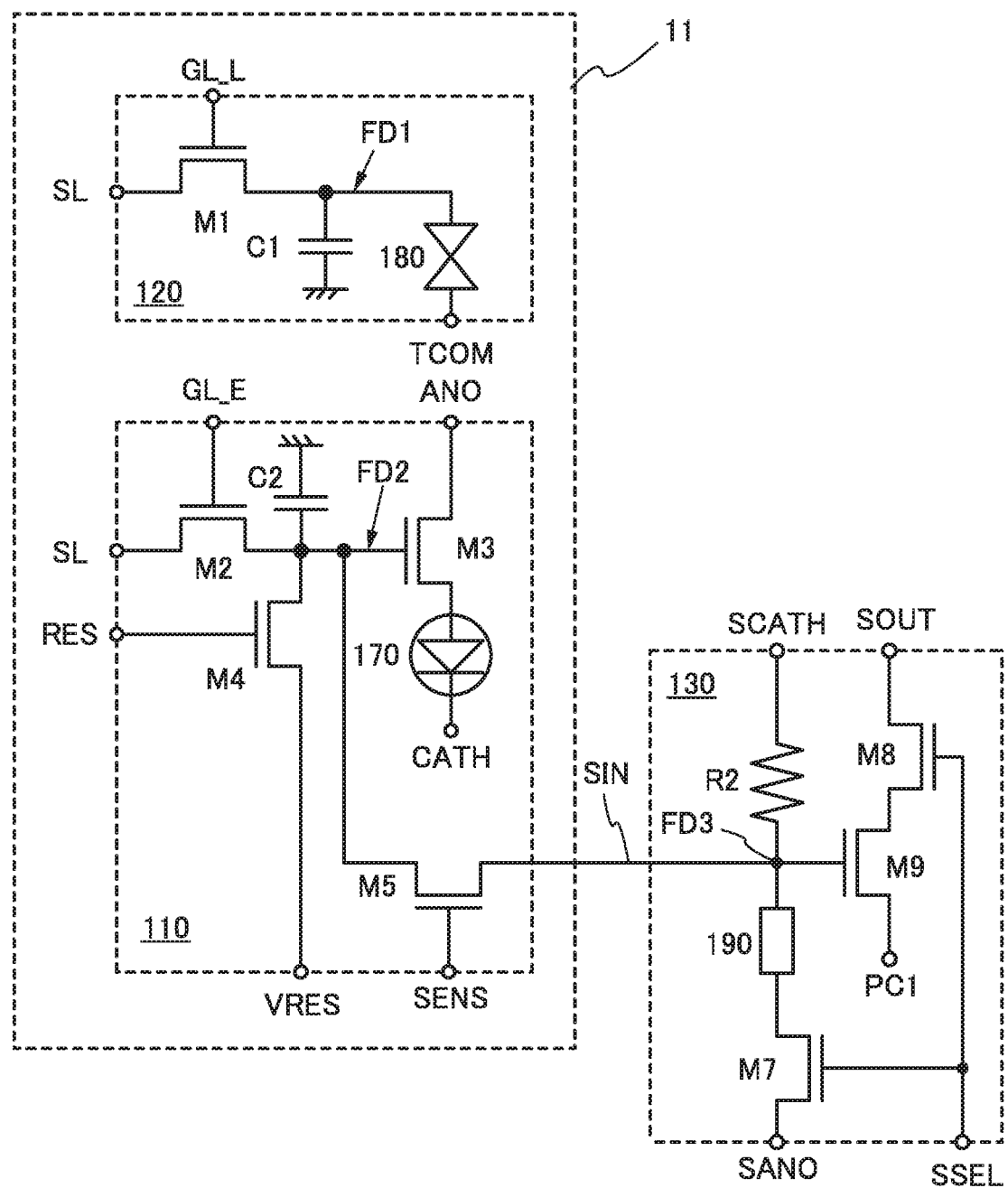
FIG. 12 is a circuit diagram illustrating a structure example of a display pixel and a sensing pixel.

A circuit diagram shown in FIG. 12 is an example in which a transistor M7, a transistor M8, a transistor M9, a wiring PC1, a wiring SSEL, and a wiring SOUT are added to the sensing pixel 130 in FIG. 1.

On/off of the transistor M8 is controlled by the potential of the wiring SSEL. When the transistor M5 is turned on, a signal corresponding to the potential of the node FD3 is output from the wiring SOUT. The signal output from the wiring SOUT is processed in a logic circuit 23 that is described later, so that how the information terminal 10 is bent can be sensed.

In a similar manner to the transistor M8, on/off of the transistor M7 is controlled by the potential of the wiring SSEL. When the transistor M7 is off, current does not flow between the wiring SANO and the wiring SCATH; therefore, the information terminal 10 can suppress the power consumption. When the transistor M7 is on, the potential of the node FD3 can be represented by the aforementioned formula (1), and the sensing pixel 130 can sense strain.

A constant potential is applied to the wiring PC1.

Next, the sensing pixel array 13 and its peripheral circuits will be described with reference to FIG. 13.

Figure 13:
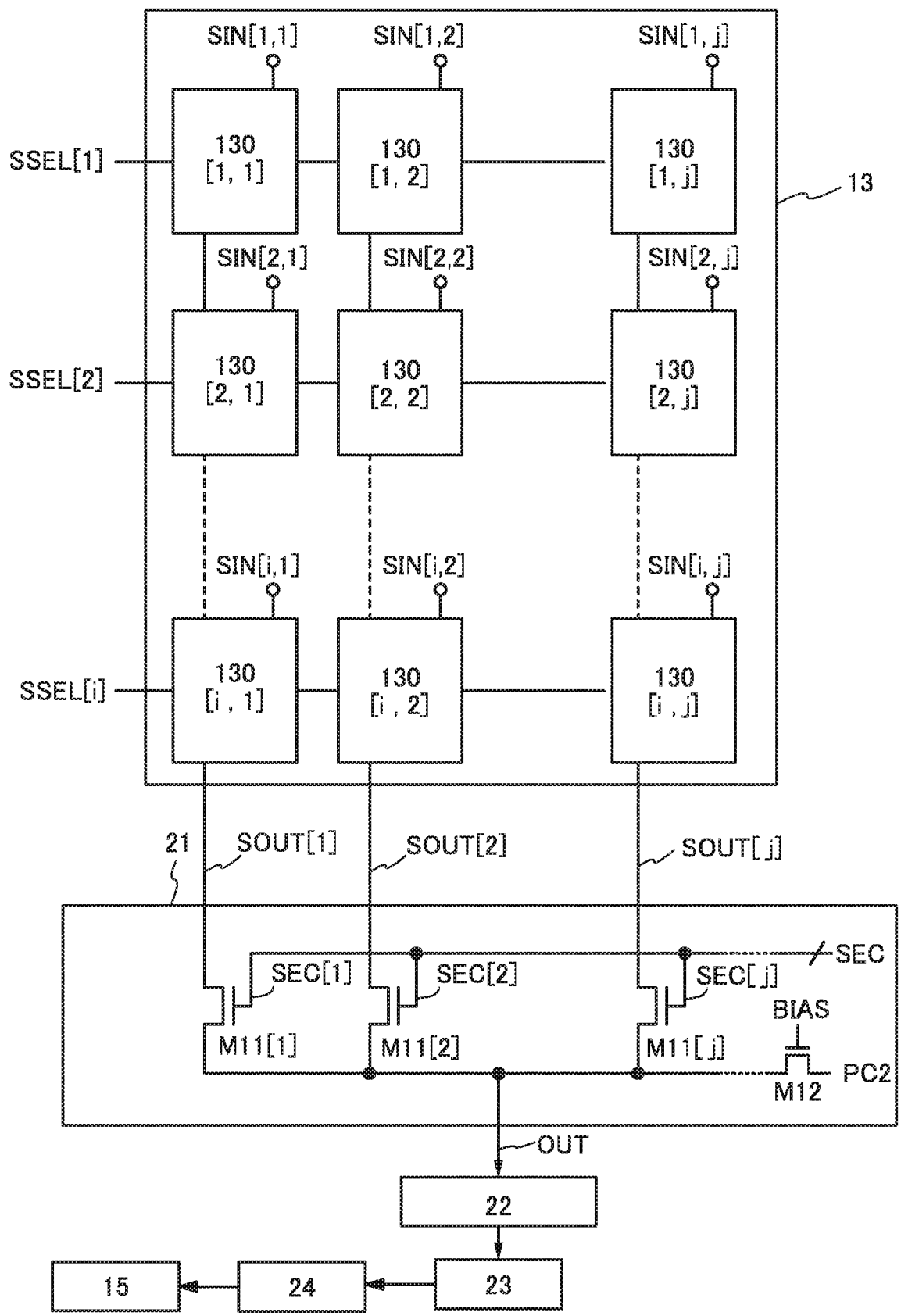
FIG. 13 is a circuit diagram illustrating a structure example of a display pixel array.

In FIG. 13, the sensing pixel array 13, a multiplexer 21, an A/D converter 22, a logic circuit 23, a host 24, and a source driver 15 are illustrated. The sensing pixel array 13 includes the sensing pixels 130 arranged in a matrix with i rows and j columns.

The multiplexer 21 has a function of selecting one from the wirings SOUT[1] to SOUT[j], and outputting a signal to the wiring OUT.

The multiplexer 21 includes transistors M11[1] to M11[j] and a transistor M12. When a selection signal is input to the wiring SEC, one of the transistors M11[1] to M11[j] is selected and turned on. Then, a signal is output to the wiring OUT.

A constant potential is applied to the wiring PC2. A potential higher than that of the wiring PC1 is preferably applied to the wiring PC2.

A wiring BIAS is connected to a gate of the transistor M12, and drain current of the transistor M12 changes in response to the potential of the wiring BIAS. The transistor M12 has a function as a current supply, and a potential to be output to the wiring OUT is determined by resistance division with the transistor M9 in each of the sensing pixels 130.

The signal output to the wiring OUT is converted into a digital signal via the A/D converter 22.

The logic circuit 23 has a function of sensing a position and amount of the strain applied to the information terminal 10 on the basis of the digital signal which is output from the A/D converter 22.

The logic circuit 23 transmits information on the sensed strain to the host 24, for example. The host 24 can perform image processing and apply a video signal to the source driver 15 on the basis of the information transmitted from the logic circuit 23.

Embodiment 3

In this embodiment, a structure example of the display panel described in the above embodiment will be described with reference to FIG. 14.

Figure 14:
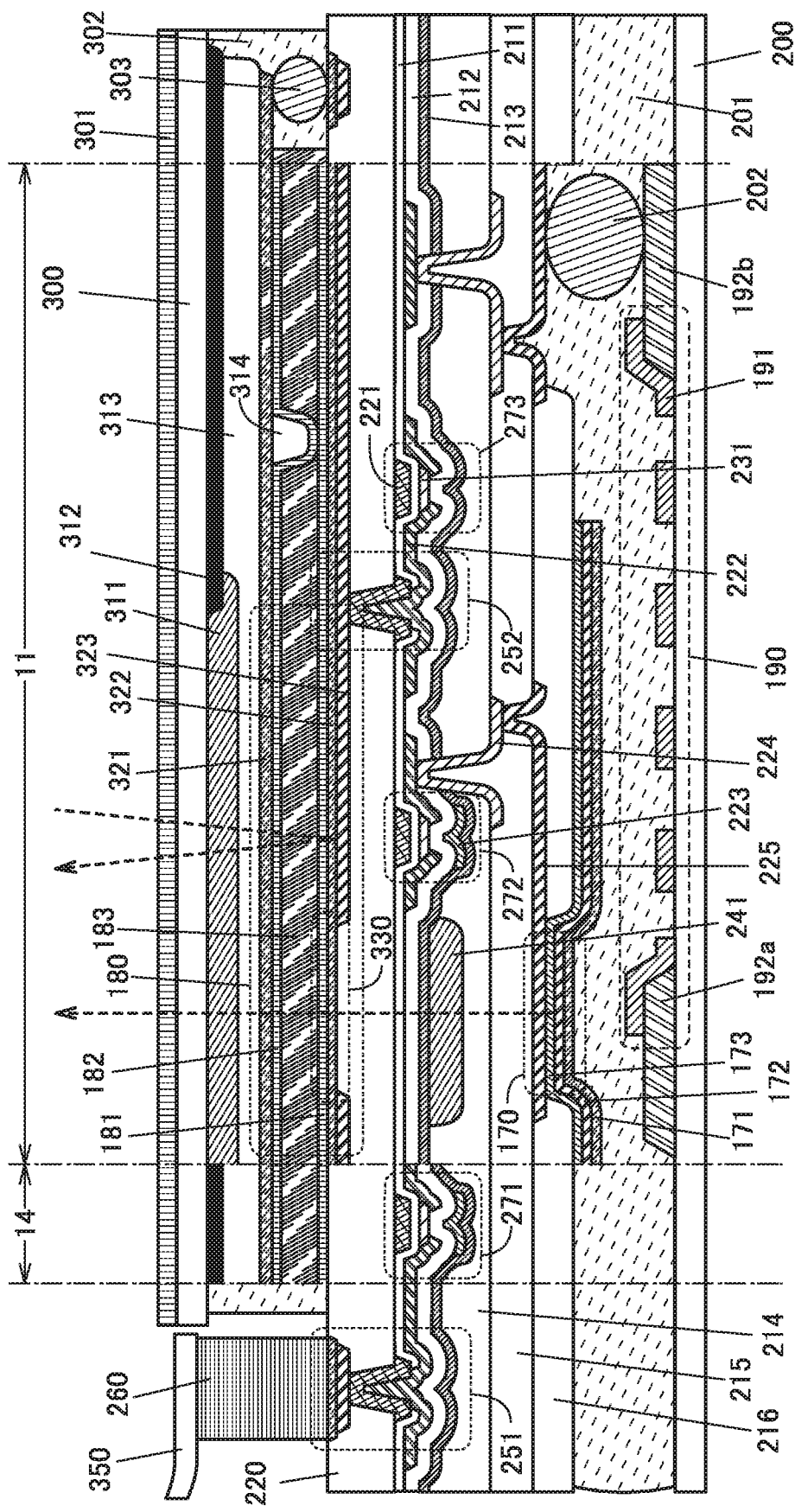
FIG. 14 is a cross-sectional view illustrating a structure example of a display panel.

FIG. 14 is a cross-sectional view of the display panel 30 illustrated in FIG. 8 and FIGS. 9A and 9B.

The display panel 30 illustrated in FIG. 14 includes an insulating layer 220 between a film 200 and a film 300. The display panel 30 also includes the strain sensor element 190, the light-emitting element 170, a transistor 271, a transistor 272, a transistor 273, a coloring layer 241, and the like between the film 200 and the insulating layer 220. Furthermore, the display panel 30 includes the liquid crystal element 180, the coloring layer 311, and the like between the insulating layer 220 and the film 300. The film 300 and the insulating layer 220 are bonded with an adhesive layer 302. The film 200 and the insulating layer 220 are bonded with an adhesive layer 201.

The films 200 and 300 are preferably flexible. For the films 200 and 300, for example, metal, an alloy, resin, glass, or fiber thereof can be used. Examples of the resin include polyester, polyolefin, polyamide (e.g., nylon or aramid), polyimide, polycarbonate, acrylic, and polytetrafluoroethylene (PTFE).

The transistor 273 is electrically connected to the liquid crystal element 180 and the transistor 272 is electrically connected to the light-emitting element 170. Since the transistors 272 and 273 are formed on a surface of the insulating layer 220 which is on the film 200 side, the transistors 272 and 273 can be formed through the same process.

Figure 15:
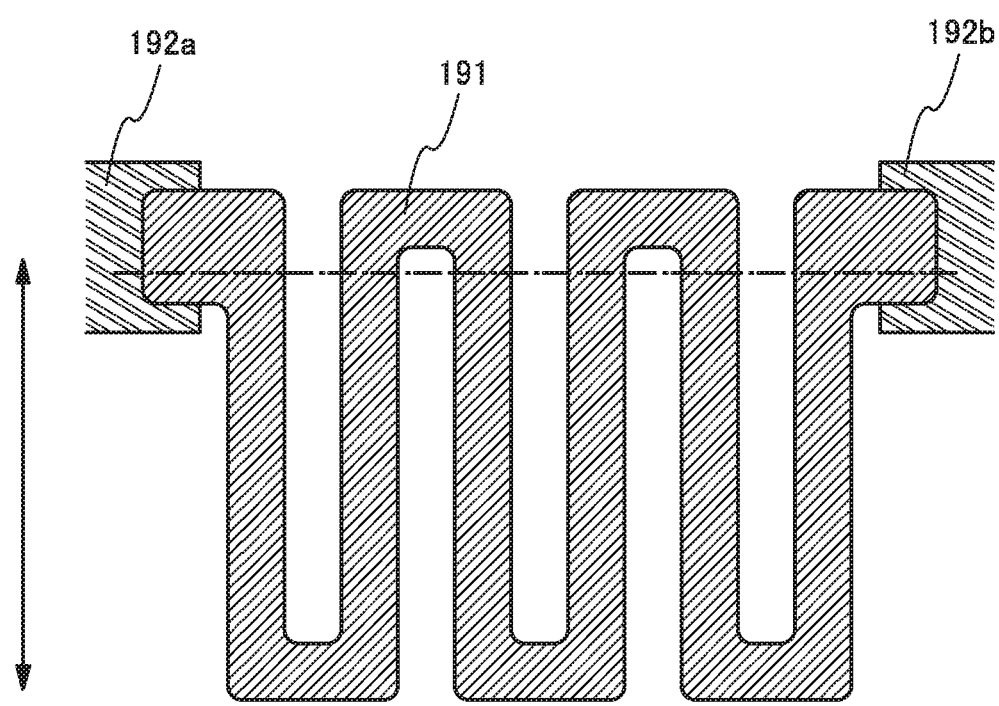
FIG. 15 is a top view illustrating a structure example of a strain sensor element.

The film 200 is provided with the strain sensor element 190. The strain sensor element 190 is formed using a conductive layer 191, a conductive layer 192a, and a conductive layer 192b. The strain sensor element 190 in FIG. 14 is a strain sensor element including a metal thin film resistor. FIG. 15 is a top view of the strain sensor element 190. The strain sensor element 190 can sense a change in shape in the direction indicated by the arrow in FIG. 15. FIG. 14 is a cross-sectional view taken along dashed-dotted line in FIG. 15.

The coloring layer 311, a light-blocking layer 312, an insulating layer 313, a conductive layer 321 functioning as a common electrode of the liquid crystal element 180, an alignment film 182, an insulating layer 314, and the like are provided over the film 300. The insulating layer 314 serves as a spacer for holding a cell gap of the liquid crystal element 180.

Insulating layers such as an insulating layer 211, an insulating layer 212, an insulating layer 213, an insulating layer 214, an insulating layer 215, and the like are provided on the film 200 side of the insulating layer 220. Part of the insulating layer 211 functions as a gate insulating layer of each transistor. The insulating layer 212, the insulating layer 213, and the insulating layer 214 are provided to cover each transistor. The insulating layer 215 is provided to cover the insulating layer 214. The insulating layers 214 and 215 each function as a planarization layer. Note that an example where the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided. The insulating layer 214 functioning as a planarization layer is not necessarily provided when not needed.

The transistor 271, the transistor 272, and the transistor 273 each include a conductive layer 221 part of which functions as a gate, conductive layers 222 part of which functions as a source and a drain, and a semiconductor layer 231. Here, a plurality of layers obtained by processing the same conductive film are shown with the same hatching pattern.

The liquid crystal element 180 is a reflection-type liquid crystal element. The liquid crystal element 180 has a stacked structure of a conductive layer 322, liquid crystal 183, and the conductive layer 321. A conductive layer 323 which reflects visible light is provided in contact with the conductive layer 322 on the film 200 side. The conductive layer 323 has an opening 330. The conductive layers 322 and 321 transmit visible light. In addition, an alignment film 181 is provided between the liquid crystal 183 and the conductive layer 322 and the alignment film 182 is provided between the liquid crystal 183 and the conductive layer 321. A polarizing plate 301 is provided on an outer surface of the film 300.

In the liquid crystal element 180, the conductive layer 323 has a function of reflecting visible light, and the conductive layer 321 has a function of transmitting visible light. Light entering from the film 300 side is polarized by the polarizing plate 301, passes through the conductive layer 321 and the liquid crystal 183, and is reflected by the conductive layer 323. Then, the light passes through the liquid crystal 183 and the conductive layer 321 again and reaches the polarizing plate 301. At this time, alignment of the liquid crystal is controlled with a voltage that is applied between the conductive layer 323 and the conductive layer 321, and thus optical modulation of light can be controlled. That is, the intensity of light emitted through the polarizing plate 301 can be controlled. Light excluding light in a particular wavelength region is absorbed by the coloring layer 311, and thus, emitted light is red light, for example.

The light-emitting element 170 is a bottom-emission light-emitting element. The light-emitting element 170 has a structure in which a conductive layer 225, an EL layer 173, and a conductive layer 172 are stacked in this order from the insulating layer 220 side. The insulating layer 216 covers an end portion of the conductive layer 225. In addition, a conductive layer 171 is provided to cover the conductive layer 172. The conductive layer 171 contains a material reflecting visible light, and the conductive layers 225 and 172 contain a material transmitting visible light. Light is emitted from the light-emitting element 170 to the film 300 side through the coloring layer 241, the insulating layer 220, the opening 330, the conductive layer 321, and the like.

Here, as illustrated in FIG. 14, the conductive layer 322 transmitting visible light is preferably provided in the opening 330. Accordingly, the liquid crystal 183 is aligned in a region overlapping with the opening 330 as well as in the other regions, in which case an alignment defect of the liquid crystal can be prevented from being generated in the boundary portion of these regions and undesired light leakage can be suppressed.

As the polarizing plate 301 provided on an outer surface of the film 300, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

One of a source and a drain of the transistor 272 is electrically connected to the conductive layer 225 of the light-emitting element 170 through a conductive layer 224.

One of a source and a drain of the transistor 273 is electrically connected to the conductive layer 323 through a connection portion 252. The conductive layers 323 and 322 are in contact with and electrically connected to each other Here, in the connection portion 252, the conductive layers provided on both surfaces of the insulating layer 220 are connected to each other through openings in the insulating layer 220.

A connection portion 251 is provided in a region where the film 200 does not overlap with the film 300. The connection portion 251 is electrically connected to the FPC 350 through a connection layer 260. On the top surface of the connection portion 251, a conductive layer obtained by processing the same conductive film as the conductive layer 322 is exposed. Thus, the connection portion 251 and the FPC 350 can be electrically connected to each other through the connection layer 260.

A connector 303 is provided in part of a region where the adhesive layer 302 is provided. The conductive layer obtained by processing the same conductive film as the conductive layer 322 is electrically connected to part of the conductive layer 321 with the connector 303. Accordingly, a signal or a potential input from the FPC 350 connected to the film 200 side can be applied to the conductive layer 321 formed on the film 300 side through the connector 303.

As the connector 303, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 303, a material capable of elastic deformation or plastic deformation is preferably used. As illustrated in FIG. 14, the connector 303 which is a conductive particle has a shape that is squeezed vertically in some cases. With the squeezed shape, the contact area between the connector 303 and a conductive layer electrically connected to the connector 303 can be increased, thereby reducing contact resistance and suppressing the generation of problems such as disconnection.

The connector 303 is preferably provided so as to be covered with the adhesive layer 302. For example, the connectors 303 are dispersed in the adhesive layer 302 before the adhesive layer 302 is cured.

A connector 202 is provided in part of a region where the adhesive layer 201 is provided. The conductive layer obtained by processing the same conductive film as the conductive layer 225 is electrically connected to part of the conductive layer 192b with the connector 202. The description of the connector 303 is referred to for the details of the connector 202.

FIG. 14 illustrates an example in which the transistor 271 is provided as an example of the gate driver 14.

The structure in which the semiconductor layer 231 where a channel is formed is provided between two gates is used as an example of the transistors 271 and 272 in FIG. 14. One gate is formed using the conductive layer 221 and the other gate is formed using a conductive layer 223 overlapping with the semiconductor layer 231 with the insulating layer 212 provided therebetween. Such a structure enables control of threshold voltages of transistors. In that case, the two gates may be connected to each other and supplied with the same signal to operate the transistors. Such transistors can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or definition.

The transistors 271, 272, and 273 are preferably OS transistors. Therefore, an oxide semiconductor is preferably used for the semiconductor layer 231. Examples of the oxide semiconductors that can be used for the semiconductor layer 231 include an In—Ga oxide, an in-Zn oxide, and an In-AM-Zn oxide (M is Ti, Ga, Y, Zr, La, Ce, Nd, Sn, or Hf). Note that the oxide semiconductor is not limited to an oxide containing In. The oxide semiconductor may be, for example, a Zn oxide, a Zn—Sn oxide, or a Ga—Sn oxide.

Note that a transistor included in the gate driver 14 and a transistor included in the display pixel 11 may have the same structure. A plurality of transistors included in the gate driver 14 may all have the same structure or different structures. A plurality of transistors included in the display pixel 11 may all have the same structure or different structures.

A material through which impurities such as water or hydrogen do not easily diffuse is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and a highly reliable display panel can be provided.

The insulating layer 313 is provided on the film 300 side to cover the coloring layer 311 and the light-blocking layer 312. The insulating layer 313 may have a function as a planarization layer. The insulating layer 313 enables the conductive layer 321 to have an almost flat surface, resulting in a uniform alignment state of the liquid crystal 183.

An example of the method for fabricating the display panel 30 will be described. For example, the conductive layer 322, the conductive layer 323, and the insulating layer 220 are formed in this order over a supporting substrate provided with a separation layer, and the transistor 272, the transistor 273, the light-emitting element 170, and the like are formed. Then, the film 200 where the strain sensor element 190 is formed and the supporting substrate are bonded with the adhesive layer 201. After that, separation is performed at the interface between the separation layer and each of the insulating layer 220 and the conductive layer 322, whereby the supporting substrate and the separation layer are removed. Separately, the coloring layer 311, the light-blocking layer 312, the conductive layer 321, and the like are formed over the film 300 in advance. Then, the liquid crystal 183 is dropped onto the film 200 or the film 300 and the films 200 and 300 are bonded with the adhesive layer 302, whereby the display panel 30 can be fabricated.

A material for the separation layer can be selected such that separation at the interface with the insulating layer 220 and the conductive layer 322 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer 220 over the separation layer. The use of the high-melting-point metal material for the separation layer can increase the formation temperature of a layer formed in a later step, which reduces impurity concentration and achieves a highly reliable display device.

As the conductive layer 322, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 322.

As described above, with the use of the information terminal 10 described in this embodiment, a low power consumption information terminal can be provided. Alternatively, an information terminal with excellent visibility can be provided. Alternatively, a novel information terminal can be provided.

Embodiment 4

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher in concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) is used to obtain an EDX mapping image, and according to the EDX mapping image, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_3$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Unless otherwise specified, on-state current in this specification refers to drain current of a transistor in an on state. Unless otherwise specified, the on state (also sometimes abbreviated to "on") of an n-channel transistor means that the voltage between its gate and source ($V_G$) is higher than or equal to the threshold voltage ($V_{th}$), and the on state of a p-channel transistor means that $V_G$ is lower than or equal to $V_{th}$. For example, the on-state current of an n-channel transistor refers to drain current that flows when $V_G$ is higher than or equal to $V_{th}$. The on-state current of a transistor depends on a voltage ($V_D$) between a drain and a source in some cases.

Unless otherwise specified, off-state current in this specification refers to drain current of a transistor in an off state. Unless otherwise specified, the off state (also sometimes abbreviated to "off") of an n-channel transistor means that $V_G$ is lower than $V_{th}$, and the off state of a p-channel transistor means that $V_G$ is higher than $V_{th}$. For example, the off-state current of an n-channel transistor refers to drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_D$ used in a semiconductor device or the like including the transistor.

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

For example, in this specification and the like, an explicit description "X and Y are connected" means that X and Y are electrically connected, and X and Y are directly connected.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

This application is based on Japanese Patent Application serial No. 2016-130327 filed with Japan Patent Office on Jun. 30, 2016, the entire contents of which are hereby incorporated by reference.

What is claimed is:

1. An information terminal comprising:
   a touch sensor; and
   a display panel capable of display information input via the touch sensor, the display panel comprising:
      a first display element;
      a second display element; and
      a strain sensor; and
   wherein the information terminal is configured so that light emitted by the second display element is sighted by a user of the information terminal when the strain sensor does not sense strain whereas light reflected by the first display element is sighted by the user of the information terminal when the strain sensor senses strain.

2. The information terminal according to claim 1, wherein the strain sensor comprises a metal thin film resistor.

3. The information terminal according to claim 1, wherein the strain sensor comprises a piezoelectric element.

4. The information terminal according to claim 1, comprising:
   a display portion comprising:
      the first display element;
      the second display element;
      a first transistor; and
      a second transistor; and
   the strain sensor comprising:
      a strain sensor element; and
      a resistor comprising a first terminal electrically connected to a first terminal of the strain sensor element and electrically connected to a gate of the first transistor via the second transistor;
   wherein:
   the first transistor is configured to control current flowing into the second display element; and
   the strain sensor element is configured to be as a variable resistor.

5. The information terminal according to claim 4, wherein the first transistor and the second transistor each comprise a channel formation region including an oxide semiconductor.

6. The information terminal according to claim 4, wherein the strain sensor element is a metal thin film resistor.

7. The information terminal according to claim 4, wherein the strain sensor element is a piezoelectric element.

8. An information terminal comprising:
   a touch sensor; and
   a display panel capable of display information input via the touch sensor, the display panel comprising:
      a first display element;
      a second display element; and
      a strain sensor,
   wherein the information terminal s configured so that light reflected by the first display element is sighted by a user of the information terminal when the strain sensor does not sense strain whereas light emitted by the second display element is sighted by the user of the information terminal when the strain sensor senses strain.

9. The information terminal according to claim 8, wherein the strain sensor comprises a metal thin film resistor.

10. The information terminal according to claim 8, wherein the strain sensor comprises a piezoelectric element.

11. The information terminal according to claim 8, comprising:
    a display portion comprising:
       the first display element;
       the second display element;
       a first transistor; and
       a second transistor; and
    the strain sensor comprising:
       a strain sensor element; and
       a resistor comprising a first terminal electrically connected to a first terminal of the strain sensor element and electrically connected to a gate of the first transistor via the second transistor,
    wherein:
    the first transistor is configured to control current flowing into the second display element; and
    the strain sensor element is configured to be as a variable resistor.

12. The information terminal according to claim 11, wherein the first transistor and the second transistor each comprise a channel formation region including an oxide semiconductor.

13. The information terminal according to claim 11, wherein the strain sensor element is a metal thin film resistor.

14. The information terminal according to claim 11, wherein the strain sensor element is a piezoelectric element.

15. A display panel comprising:
    a first display element;
    a second display element; and
    a strain sensor; and
    wherein the display panel is configured so that light emitted by the second display element is sighted by a user of the display panel when the strain sensor does not sense strain whereas light reflected by the first display element is sighted by the user of the display panel when the strain sensor senses strain.

16. The display panel according to claim 15, wherein the strain sensor comprises a metal thin film resistor.

17. The display panel according to claim 15, wherein the strain sensor comprises a piezoelectric element.

18. The display panel according to claim 15, comprising:
a display portion comprising:
the first display element;
the second display element;
a first transistor; and
a second transistor; and
the strain sensor comprising:
a strain sensor element; and
a resistor comprising a first terminal electrically connected to a first terminal of the strain sensor element and electrically connected to a gate of the first transistor via the second transistor,
wherein:
the first transistor is configured to control current flowing into the second display element; and
the strain sensor element is configured to be as a variable resistor.

19. The display panel according to claim 18, wherein the first transistor and the second transistor each comprise a channel formation region including an oxide semiconductor.

20. The display panel according to claim 18, wherein the strain sensor element is a metal thin film resistor.

21. The display panel according to claim 18, wherein the strain sensor element is a piezoelectric element.

22. A display panel comprising:
a first display element;
a second display element; and
a strain sensor,
wherein the display panel is configured so that light reflected by the first display element is sighted by a user of the display panel when the strain sensor does not sense strain whereas light emitted by the second display element is sighted by the user of the display panel when the strain sensor senses strain.

23. The display panel according to claim 22, wherein the strain sensor comprises a metal thin film resistor.

24. The display panel according to claim 22, wherein the strain sensor comprises a piezoelectric element.

25. The display panel according to claim 22, comprising:
a display portion comprising:
the first display element;
the second display element;
a first transistor; and
a second transistor; and
the strain sensor comprising:
a strain sensor element; and
a resistor comprising a first terminal electrically connected to a first terminal of the strain sensor element and electrically connected to a gate of the first transistor via the second transistor,
wherein:
the first transistor is configured to control current flowing into the second display element; and
the strain sensor element is configured to be as a variable resistor.

26. The display panel according to claim 25, wherein the first transistor and the second transistor each comprise a channel formation region including an oxide semiconductor.

27. The display panel according to claim 25, wherein the strain sensor element is a metal thin film resistor.

28. The display panel according to claim 25, wherein the strain sensor element is a piezoelectric element.

* * * * *